(12) United States Patent
Hirosaki et al.

(10) Patent No.: US 9,617,471 B2
(45) Date of Patent: Apr. 11, 2017

(54) INORGANIC PHOSPHOR, MANUFACTURE THEREOF, LIGHT-EMITTING DEVICE, AND IMAGE DISPLAY UTILIZING INORGANIC PHOSPHOR

(71) Applicant: National Institute for Materials Science, Ibaraki (JP)

(72) Inventors: Naoto Hirosaki, Ibaraki (JP); Takashi Takeda, Ibaraki (JP); Shiro Funahashi, Ibaraki (JP); Eiichirou Narimatsu, Ibaraki (JP)

(73) Assignee: National Institute of Materials Science, Tsukuba-shi (JP)

( * ) Notice: Subject to any disclaimer, the term of this patent is extended or adjusted under 35 U.S.C. 154(b) by 0 days.

(21) Appl. No.: 14/786,248

(22) PCT Filed: Apr. 24, 2014

(86) PCT No.: PCT/JP2014/061578
§ 371 (c)(1),
(2) Date: Oct. 22, 2015

(87) PCT Pub. No.: WO2014/175385
PCT Pub. Date: Oct. 30, 2014

(65) Prior Publication Data
US 2016/0060518 A1    Mar. 3, 2016

(30) Foreign Application Priority Data
Apr. 25, 2013 (JP) ................. 2013-092694

(51) Int. Cl.
*H01L 33/00* (2010.01)
*C09K 11/77* (2006.01)
*H01L 33/50* (2010.01)

(52) U.S. Cl.
CPC ...... *C09K 11/7792* (2013.01); *C09K 11/7721* (2013.01); *C09K 11/7734* (2013.01);
(Continued)

(58) Field of Classification Search
CPC ..... H01L 2224/48091; H01L 2924/181; H01L 2924/00012; H01L 2924/00014;
(Continued)

(56) References Cited

U.S. PATENT DOCUMENTS

| | | |
|---|---|---|
| 3,420,791 A | 1/1969 | Gurgiolo et al. |
| 2002/0105269 A1 | 8/2002 | Ellens et al. |

(Continued)

FOREIGN PATENT DOCUMENTS

| | | |
|---|---|---|
| CN | 101760191 A | 6/2010 |
| CN | 102925153 A | 2/2013 |

(Continued)

OTHER PUBLICATIONS

Supplemental Partial European Search Report for related application EP14788676; Mar. 2, 2016.
(Continued)

*Primary Examiner* — Duy T Nguyen
(74) *Attorney, Agent, or Firm* — Trojan Law Offices

(57) ABSTRACT

Provided is a chemically and thermally stable phosphor having different light-emitting characteristics than a conventional phosphor and having high light-emitting intensity even when combined with an LED of 410 nm or lower. The phosphor comprises an inorganic compound in which an inorganic crystal including A element, D element, X element (A is one or more elements selected from Mg, Ca, Sr, and Ba; D is one or more elements selected from Si, Ge, Sn, Ti, Zr, and Hf; and X is one or more elements selected from O, N, and F), and, if necessary, E element (where E is one or more elements selected from B, Al, Ga, In, Sc, Y, and La)

(Continued)

includes Li element and M element (where M is one or more elements selected from Mn, Ce, Pr, Nd, Sm, Eu, Tb, Dy, and Yb).

15 Claims, 5 Drawing Sheets

(52) U.S. Cl.
CPC .......... *H01L 33/502* (2013.01); *H01L 33/504* (2013.01); *H01L 2224/48091* (2013.01); *H01L 2224/48247* (2013.01); *H01L 2224/8592* (2013.01); *H01L 2924/181* (2013.01)

(58) Field of Classification Search
CPC ... H01L 2224/48247; H01L 2224/8592; H01L 33/502; H01L 33/504; C09K 11/7721; C09K 11/7734; C09K 11/7792
See application file for complete search history.

(56) References Cited

U.S. PATENT DOCUMENTS

| | | |
|---|---|---|
| 2003/0020101 A1 | 1/2003 | Bogner et al. |
| 2003/0024438 A1 | 2/2003 | Botty et al. |
| 2004/0135504 A1 | 7/2004 | Tamaki et al. |
| 2005/0052878 A1 | 3/2005 | Yamada et al. |
| 2005/0227569 A1* | 10/2005 | Maeda ............... C09K 11/025 445/25 |
| 2006/0192178 A1 | 8/2006 | Hirosaki |
| 2007/0007494 A1 | 1/2007 | Hirosaki et al. |
| 2007/0018567 A1 | 1/2007 | Hirosaki |
| 2007/0108896 A1 | 5/2007 | Hirosaki |
| 2009/0066230 A1 | 3/2009 | Hirosaki et al. |
| 2009/0153028 A1 | 6/2009 | Hirosaki |
| 2009/0236969 A1 | 9/2009 | Hirosaki |
| 2010/0052513 A1 | 3/2010 | Xia et al. |
| 2010/0072498 A1 | 3/2010 | Xie et al. |
| 2010/0096592 A1 | 4/2010 | Becker et al. |
| 2010/0155753 A1 | 6/2010 | Imanari et al. |
| 2011/0163344 A1 | 7/2011 | Cakmak |
| 2012/0019127 A1 | 1/2012 | Hirosaki |
| 2012/0037941 A1 | 2/2012 | Schmidt et al. |
| 2012/0176568 A1 | 7/2012 | Hirosaki |
| 2013/0127333 A1 | 5/2013 | Jia et al. |
| 2014/0028179 A1 | 1/2014 | Hirosaki et al. |
| 2015/0070875 A1 | 3/2015 | Hirosaki et al. |
| 2015/0146408 A1 | 5/2015 | Hirosaki et al. |

FOREIGN PATENT DOCUMENTS

| | | |
|---|---|---|
| JP | A 1977(S52)-8993 | 1/1977 |
| JP | A 2002-322474 | 11/2002 |
| JP | B 3668770 | 4/2005 |
| JP | A 2005-239936 | 9/2005 |
| JP | B 3837551 | 8/2006 |
| JP | B 4524368 | 6/2010 |
| JP | A 2011-040584 | 2/2011 |
| JP | A 2011-052099 | 3/2011 |
| JP | A 2013-185045 | 9/2013 |
| JP | A 2014-031496 | 2/2014 |

OTHER PUBLICATIONS

"Photoluminescence properties of rare-earth activated BaS7N10", Li Y. Q., et. al., Journal of Alloys and Compounds, Elsevier Sequoia, Lausanne, CH, vol. 487, No. 1-2, Nov. 13, 2009 (Nov. 13, 2009), pp. 28-33, XP026742212, ISSN: 0925-8388, DOI: 10.1016/J. JALLCOM.2009.08.019 [retrieved on Aug. 15, 2009].

"Edge-sharing SiN4 Tetrahedra in the Highly Condensed Nitridosilicate BaSi7N10", Hubert Huppertz and Wolfgang Schnick, Chem. Eur. J., vol. 3, No. 2, p. 249-252, 1997.

"Crystal structure and mechanical properties of SrSi7N10", Guillaume Pilet, et. al., Solid State Sciences, vol. 7, No. 4, p. 391-396, 2005.

\* cited by examiner

INORGANIC PHOSPHOR, MANUFACTURE THEREOF, LIGHT-EMITTING DEVICE, AND IMAGE DISPLAY UTILIZING INORGANIC PHOSPHOR

TECHNICAL FIELD

The present invention relates to a phosphor, a manufacturing method thereof, and an application thereof, the phosphor comprising an inorganic compound as a main component, the inorganic compound comprising a Li element and an M element (where M is one or two or more elements selected from the group consisting of Mn, Ce, Pr, Nd, Sm, Eu, Tb, Dy, and Yb.), the inorganic compound comprising an inorganic crystal including at least an A element, a D element, and an X element (where A is one or two or more elements selected from the group consisting of Mg, Ca, Sr, and Ba; D is one or two or more elements selected from the group consisting of Si, Ge, Sn, Ti, Zr, and Hf; and X is one or two or more elements selected from the group consisting of O, N, and F.), and the inorganic crystal, if necessary, further including an E element (where E is one or two or more elements selected from the group consisting of B, Al, Ga, In, Sc, Y, and La.).

BACKGROUND ART

The phosphor is utilized in a fluorescent display tube (VFD: vacuum-fluorescent display), a field emission display (FED: Field Emission Display or SED: Surface-Conduction Electron-Emitter Display), a plasma display panel (PDP: Plasma Display Panel), a cathode-ray tube (CRT: Cathode-Ray Tube), a liquid-crystal display backlight (Liquid-Crystal Display Backlight), a white light-emitting diode (LED: Light-Emitting Diode), and so on. In any of these applications, it is necessary to provide the phosphor with energy to excite the phosphor in order to make the phosphor emit fluorescence and the phosphor is excited by an excitation source with high energy such as a vacuum ultraviolet ray, an ultraviolet ray, an electron beam, and blue light so as to emit a visible light ray such as blue light, green light, yellow light, orange light, and red light. However, as a result of the phosphor being exposed to such excitation source, the luminance of the phosphor tends to decrease and a phosphor having little degradation in the brightness is desired. Therefore, a phosphor having an inorganic crystal containing nitrogen in a crystal structure thereof as a host crystal, instead a phosphor such as a silicate phosphor, a phosphate phosphor, a aluminate phosphor, and a sulfide phosphor, has been proposed, as exemplified by a sialon phosphor, an oxynitride phosphor, or a nitride phosphor, which is characterized by low brightness deterioration caused by high energy excitation.

An example of the sialon phosphors is manufactured by a manufacturing process as generally described below. First, silicon nitride ($Si_3N_4$), aluminum nitride (AlN), and europium oxide ($Eu_2O_3$) are mixed in predetermined molar ratios and the resultant mixture is fired by a hot press method in one atmospheric pressure (0.1 MPa) of nitrogen atmosphere at 1700° C. for one hour (for example, refer to Patent Reference 1). It was reported that α-sialon activated with an Eu ion ($Eu^{2+}$) manufactured by the above processes had become a phosphor emitting yellow light in a wavelength range of 550 nm to 600 nm if excited by blue light having a wavelength range of 450 to 500 nm. And it is known that an emission wavelength may vary as a ratio of Si to Al or a ratio of oxygen to nitrogen is changed while the α-sialon crystal structure is maintained (for example, refer to Patent References 2 and 3).

As another example of the sialon phosphor, a green phosphor in which β type sialon is activated by $Eu^{2+}$ is known (refer to Patent Reference 4). It is known that, in the phosphor, an emission wavelength thereof may shift to a shorter wavelength by changing the oxygen content while the crystal structure remains the same (for example, refer to Patent Reference 5). Moreover, it is known that a blue phosphor is to be formed when activated by $Ce^{3+}$ (for example, refer to Patent Reference 6).

As an example of an oxynitride phosphor, a blue phosphor having a JEM phase ($LaAl(Si_{6-z}Al_z)N_{10-z}O_z$) as a host crystal, which is activated by Ce (refer to Patent Reference 7), is known. It is known that, in the phosphor, an emission wavelength thereof may shift to a longer wavelength as well as an excitation wavelength thereof may shift to a longer wavelength by substituting part of La with Ca while the crystal structure remains the same.

As another example of the oxynitride phosphor, a blue phosphor having a La—N crystal $La_3Si_8N_{11}O_4$ as a host crystal, which is activated by Ce, is known (refer to Patent Reference 8).

As an example of the nitride phosphor, a red phosphor having a crystal of $CaAlSiN_3$ as a host crystal, which is activated by $Eu^{2+}$, is known (refer to Patent Reference 9). Color rendering properties of a white LED are improved by utilizing this phosphor. A phosphor to which Ce was added as the activating element was reported to be an orange phosphor.

As a host crystal of another nitride phosphor, $Ba_1Si_7N_{10}$ or $Sr_1Si_7N_{10}$ is known (refer to Non-Patent References 1 and 2). It was reported that a phosphor having $Ba_1Si_7N_{10}$ as the host crystal to which $Eu^{2+}$ was added rendered blue color emission if excited by an ultraviolet ray (refer to Non-Patent Reference 3). Further, it was reported that a phosphor having $Sr_1Si_7N_{10}$ as the host crystal to which $Ce^{3+}$ was added also rendered blue color emission (refer to Patent Reference 10).

Thus, an emission color of the phosphor is determined by a combination of the crystal to act as the host crystal and a metal ion (activating ion) being incorporated into the crystal. Further, the combination of the host crystal and the activating ion determines emission characteristics such as an emission spectrum and an excitation spectrum, chemical stability, and thermal stability such that a phosphor is regarded as another different phosphor when a host crystal thereof or an activating ion thereof is different. Moreover, a material having a different crystal structure is different in the emission characteristics or in the stability because the host crystal is different even if the material has the same chemical composition such that the material is regarded as another different phosphor.

From the described above, it is important to find a host crystal having a new crystal structure in developing a new phosphor and it is possible to propose a new phosphor by activating such a host crystal with an emission-causing metal ion to make the host crystal exhibit luminescence characteristics.

PRIOR ART REFERENCES

Patent References

[Patent Reference 1] Japanese Patent No. 3668770, Specification.
[Patent Reference 2] Japanese Patent No. 3837551, Specification.
[Patent Reference 3] Japanese Patent No. 4524368, Specification.
[Patent Reference 4] Japanese Patent No. 3921545, Specification.
[Patent Reference 5] International Publication No. WO 2007/066733
[Patent Reference 6] International Publication No. WO 2006/101096
[Patent Reference 7] International Publication No. WO 2005/019376
[Patent Reference 8] Japanese Patent Application Publication No. 2005-112922
[Patent Reference 9] Japanese Patent No. 3837588, Specification
[Patent Reference 10] Japanese Patent Application Publication No. 2002-322474

Nonpatent Reference

[Nonpatent Reference 1] Huppertz et. al., Chem. Eur. J., Vol. 3, No. 2, p.249-252, 1997
[Nonpatent Reference 2] Pilet et. al., Solid State Sciences, Vol. 7, No. 4, p.391-396, 2005

SUMMARY OF THE INVENTION

Problem to be Solved by the Invention

The present invention aims to satisfy such demand and it is one of the objects to provide a phosphor that has emission characteristics (emission color and excitation characteristics, emission spectrum) different from those of a conventional phosphor, exhibits high emission intensity even when combined with an LED with a wavelength of 410 nm or less, and is chemically and thermally stable. It is another object of the present invention to provide a light-emitting device that utilizes such a phosphor and is excellent in durability and an image display device that utilizes such a phosphor and is excellent in durability.

Means to Solve the Problem

Under such a situation, the present inventors investigated in detail a phosphor having, as a host crystal, a new crystal containing nitrogen and a crystal in which a metal element or N in the crystal structure is substituted by another kind of element, so as to find out that an inorganic compound comprising a Li element and an M element (here M is one or two or more kinds of elements selected from the group consisting of Mn, Ce, Pr, Nd, Sm, Eu, Tb, Dy, and Yb) acts as a phosphor and that a phosphor including the inorganic compound as a main component emits fluorescence of high brightness, the inorganic compound constituted of an inorganic crystal including at least an A element, a D element, and an X element (here, A is one or two or more kinds of elements selected from the group consisting of Mg, Ca, Sr, and Ba; D is one or two or more kinds of elements selected from the group consisting of Si, Ge, Sn, Ti, Zr, and Hf; and X is one or two or more kinds of elements selected from the group consisting of O, N, and F), and the inorganic crystal further including, if necessary, an E element (here, E is one or more kinds of elements selected from the group consisting of B, Al, Ga, In, Sc, Y, and La). Further, it was found out that emission in a white color is exhibited with a specific composition.

Further, it was found that, by utilizing the phosphor, a white color light-emitting diode (light-emitting device) having a small temperature fluctuation and a high emission efficiency, an illuminating device using the same, and an image display device rendering bright coloration could be obtained.

The present inventors conducted an intensive investigation in consideration of the above-mentioned background so as to successfully provide a phosphor rendering emission with a high intensity of a specific wavelength region by implementing configurations as described below. Further, a phosphor having excellent emission characteristics was successfully manufactured by employing a method described below. Further, there were successfully provided a light-emitting device, an illuminating device, an image display device, a pigment, and an ultraviolet absorber having excellent features by implementing configurations as described below.

The phosphor of the present invention comprises an inorganic compound including a Li element and an M element (here, M is one or two or more elements selected from the group consisting of Mn, Ce, Pr, Nd, Sm, Eu, Tb, Dy, and Yb) so as to solve the above-described problem, the inorganic compound constituted of an inorganic crystal including at least an A element, a D element, and an X element (here, A is one or two or more elements selected from the group consisting of Mg, Ca, Sr, and Ba; D is one or two or more elements selected from the group consisting of Si, Ge, Sn, Ti, Zr, and Hf; and X is one or two or more elements selected from the group consisting of O, N, and F), and the inorganic crystal further including, if necessary, an E element (E is one or two or more elements selected from the group consisting of B, Al, Ga, In, Sc, Y, and La).

The Li element and the M element may be solid-solved (incorporated) into the inorganic crystal.

The Li element may be solid-solved (incorporated) into the inorganic crystal as an interstitial solid solution.

The inorganic crystal may be any of (1) a crystal represented by $A_1(D,E)_7X_{10}$, (2) $Sr_1Si_7N_{10}$ crystal or a crystal having the same crystal structure as the $Sr_1Si_7N_{10}$ crystal, or (3) $Ba_1Si_7N_{10}$ crystal or a crystal having the same crystal structure as the $Ba_1Si_7N_{10}$ crystal.

The A element may be one element or a mixture of two elements selected from the group consisting of Sr and Ba, the D element may be Si, the E element may be Al, the X element may be a mixture of N and O, and the M element may be Eu.

The inorganic crystal may be a crystal that belongs to the monoclinic system and has the symmetry of space group $P_c$, and in which lattice constants thereof a, b, and c and angles α, β, and γ may be values in the following ranges.
a=0.68875±0.05 nm,
b=0.67102±0.05 nm,
c=0.96756±0.05 nm,
α=90±1.5 degree,
β=106.17±1.5 degree, and
γ=90±1.5 degree.

The inorganic compound may be represented by a composition formula $L_cM_dA_eD_fE_gX_h$ (here, in the formula, c+d+e+f+g+h=1, L is a Li element, M is one or two or more kinds of elements selected from Mn, Ce, Pr, Nd, Sm, Eu, Tb, Dy, and Yb; A is one or two or more kinds of elements selected from Mg, Ca, Sr, and Ba; D is one or two or more kinds of elements selected from Si, Ge, Sn, Ti, Zr, and Hf; E is one or two or more kinds of elements selected from B, Al, Ga, In, Sc, Y, and La; and X is one or two or more kinds of elements selected from O, N, and F) and the parameters: c, d, e, f, g, and h satisfy all conditions:

$0.001 \leq c \leq 0.7$, $0.00001 \leq d \leq 0.05$, $0.01 \leq e \leq 0.1$, $0.1 \leq f \leq 0.4$, $0 \leq g \leq 0.1$, and $0.15 \leq h \leq 0.65$.

The parameters d, e, f, and g may be values in a range where all conditions of $(d+e)/(d+e+f+g)=1/8 \pm 0.014$ are satisfied.

The parameters f and g may satisfy the condition of $0.8 \leq f/(f+g) \leq 1.0$.

The ratio of h1 and h2 (here, h1+h2=h), which are numbers of N atoms and O atoms contained in the inorganic compound, respectively, may satisfy the condition of $0/10 \leq h2/(h2+h1) \leq 2/10$.

The ratio of h1 and h2 (here, h1+h2=h), which are numbers of N atoms and O atoms contained in the inorganic compound, respectively, may satisfy the condition of $0/10 \leq h2/(h2+h1) \leq 1/10$.

As the E element, at least boron may be included and the value of boron as the parameter g may satisfy the condition of $0.00001 \leq g \leq 0.01$.

The composition formula of the inorganic compound may be represented by $Li_w(Sr,Ba,Eu)_p Si_q Al_z N_s O_t$ using the parameters w, p, q, z, s, and t satisfying:

$q+z=7$, $s+t=10$, and $w+2p+4q+3z=3s+2t$.

The inorganic compound comprises a single crystal particle or an aggregate of single crystal particles having a mean particle diameter of at least 0.1 µm and not exceeding 100 µm.

The sum of Fe, Co, and Ni impurity elements included in the inorganic compound may be equal to 500 ppm or less than 500 ppm.

The phosphor may further comprise an amorphous phase or another crystal phase in addition to the inorganic compound, wherein the content amount of the inorganic compound is equal to or more than 20 mass %.

The other crystal phase or the amorphous phases can be inorganic substance having electric conductivity.

The inorganic substance having the electrical conductivity may comprise oxide, oxynitride, nitride, or a combination thereof, any one of which includes one or two or more kinds of elements selected from the group consisting of Zn, Al, Ga, In, and Sn.

The other crystal phase or the amorphous phase may be another inorganic phosphor comprising another kind of inorganic compound that is different from the above-mentioned inorganic compound.

The above-mentioned phosphor may emit fluorescence having a peak at the wavelength in the range from 470 nm to 620 nm upon irradiation by an excitation source.

The excitation source may comprise a vacuum ultraviolet ray, an ultraviolet ray, or visible light having a wavelength that is at least 100 nm and not exceeding 410 nm, or an electron beam or an X-ray.

The color of light emitted upon irradiation by an excitation source may satisfy, in terms of values of (x, y) of CIE 1931 chromaticity coordinates, the following conditions:

$0.25 \leq x \leq 0.45$ and $0.25 \leq y \leq 0.45$.

The phosphor in which Li and Al and Eu are solid-solved into $Ba_1Si_7N_{10}$ crystal, upon irradiation of light of 280 nm to 410 nm, may emit light having chromaticity where the values of (x, y) of CIE 1931 chromaticity coordinates are in the ranges of:

$0.25 \leq x \leq 0.45$ and $0.25 \leq y \leq 0.45$.

A method of manufacturing a phosphor of the present invention comprises: firing a raw material mixture of metal compounds, which can constitute the above-described phosphor by firing the raw material mixture, in a temperature range of 1,200° C. or higher and 2,200° C. or lower in an inert atmosphere including nitrogen, thereby solving the above-mentioned problem.

The above-mentioned mixture of metal compounds may comprise: a compound including Li, a compound including M, a compound including A, a compound including D, a compound including E if necessary, and a compound including X, (here, M is one or two or more kinds of elements selected from the group consisting of Mn, Ce, Pr, Nd, Sm, Eu, Tb, Dy, and Yb; A is one or two or more kinds of elements selected from the group consisting of Mg, Ca, Sr, and Ba; D is one or two or more kinds of elements selected from the group consisting of Si, Ge, Sn, Ti, Zr, and Hf; E is one or two or more kinds of elements selected from the group consisting of B, Al, Ga, In, Sc, Y, and La; and X is one or two or more kinds of elements selected from the group consisting of O, N, and F).

The compound including M may be a single kind of substance or a mixture of at least two kinds of substances selected from the group consisting of metal, silicide, oxide, carbonate, nitride, oxynitride, chloride, fluoride and oxyfluoride, each of which includes M; the compound including A may be a single kind of substance or a mixture of at least two kinds of substances selected from the group consisting of metal, silicide, oxide, carbonate, nitride, oxynitride, chloride, fluoride, and oxyfluoride, each of which includes A; and the compound including D may be a single kind of substance or a mixture of at least two kinds of substances selected from a group consisting of metal, silicide, oxide, carbonate, nitride, oxynitride, chloride, fluoride, and oxyfluoride, each of which includes D.

The compound including Li may be selected from the group consisting of metal including Li, nitride of Li, oxide of Li, chloride of Li, and fluoride of Li.

The mixture of metal compounds may include, at least, nitride or oxide of europium; nitride, oxide, or carbonate of strontium; silicon oxide or silicon nitride; and nitride of Li.

The inert atmosphere including nitrogen may comprise a nitrogen gas atmosphere in a pressure range that is at least 0.1 MPa and that does not exceed 100 MPa.

Graphite or boron nitride may be used for a heating element and a heat-insulating element of the firing furnace.

The metal compounds in a state of powder or aggregate may be fired after the metal compounds are filled in a container with a filling rate kept at the bulk density of 40% or lower.

A mean particle diameter of powder particles or aggregates of the metal compounds may be 500 μm or less.

The mean particle diameter of powder particles or aggregates of the metal compounds may be controlled to be 500 μm or less by a spray dryer, sieving, or pneumatic classification.

A mean particle diameter of phosphor powder synthesized by firing may be adjusted to be at least 50 nm and not exceeding 200 μm by applying one or more techniques selected from pulverization, classification, and acid treatment.

The phosphor powder after firing or the phosphor powder after pulverizing treatment or the phosphor powder after adjusting the particle size may be heat-treated at least 1,000° C. and not exceeding the firing temperature.

The mixture of metal compounds may be fired after an inorganic compound that forms a liquid phase at a temperature of a firing temperature or lower is added thereto and, if necessary, the content amount of the inorganic compound that forms the liquid phase at the temperature of the firing temperature or lower may be decreased by washing the thus-fired compounds with a solvent after the firing.

The inorganic compound to form the liquid phase at the temperature of the firing temperature or lower may comprise a single kind of or a mixture of two or more kinds of fluoride, chloride, iodide, bromide, or phosphate of one or two or more kinds of elements selected from the group consisting of Li, Na, K, Mg, Ca, Sr, and Ba.

The light-emitting device of the present invention comprises at least an excitation light-emitting body and a phosphor wherein the phosphor includes at least the above-described phosphor, thereby solving the above-described problem.

The excitation light-emitting body may be an organic EL light-emitting body (OLED), a semiconductor laser, a laser diode (LD), or a light-emitting diode (LED), which emits light of wavelength from 330 to 410 nm.

The light-emitting device may be a white color light-emitting diode, or an illuminating device including a plurality of white color light-emitting diodes, or a backlight for a liquid-crystal display panel.

The excitation light-emitting body may emit ultraviolet or visible light having a peak wavelength of 300 to 410 nm and the above-described phosphor may emit light of chromaticity where the values of (x, y) of CIE 1931 chromaticity coordinates are in the ranges of:
$0.25 \leq x \leq 0.45$ and
$0.25 \leq y \leq 0.45$.

The light-emitting device may further comprise a blue phosphor to emit light having a peak wavelength of 450 nm to 500 nm upon irradiation by the excitation light-emitting body.

The blue phosphor may be selected from AlN:(Eu, Si), $BaMgAl_{10}O_{17}$:Eu, $SrSi_9Al_{19}O_{31}$:Eu, $LaSi_9Al_{19}N_{32}$:Eu, α-sialon:Ce, and JEM:Ce.

The light-emitting device may further comprise a green phosphor to emit light having a peak wavelength of at least 500 nm and not exceeding 550 nm upon irradiation by the excitation light-emitting body.

The green phosphor may be selected from the group consisting of β-sialon:Eu, (Ba, Sr, Ca, Mg)$_2$SiO$_4$:Eu, (Ca, Sr, Ba)Si$_2$O$_2$N$_2$:Eu, and La$_3$Si$_6$N$_{11}$:Ce.

The light-emitting device may further comprise a yellow phosphor to emit light having a peak wavelength of at least 550 nm and not exceeding 600 nm upon irradiation by the excitation light-emitting body.

The yellow phosphor may be selected from the group consisting of YAG:Ce, α-sialon:Eu, CaAlSiN$_3$:Ce, and La$_3$Si$_6$N$_{11}$:Ce.

The light-emitting device may further comprise a red phosphor to emit light having a peak wavelength of at least 600 nm and not exceeding 700 nm upon irradiation by the light-emitting body.

The red phosphor may be selected from the group consisting of CaAlSiN$_3$:Eu, (Ca, Sr)AlSiN$_3$:Eu, Ca$_2$Si$_5$N$_8$:Eu, and Sr$_2$Si$_5$N$_8$:Eu.

With respect to the light-emitting device, the excitation light-emitting body may be an LED to emit light of wavelength of 300 to 410 nm.

With respect to the light-emitting device, a short wavelength light-absorbing material to absorb light of not exceeding 410 nm and transmit light of at least 420 nm may further be included.

The image display device of the present invention comprises an excitation source and a phosphor and is characterized by utilizing at least the above-described phosphor, thereby solving the above-described problem.

The image display device may be any of a fluorescent display tube (VFD), a field emission display (FED), a plasma display panel (PDP), a cathode-ray tube (CRT), and a liquid crystal display (LCD).

The pigment or the ultraviolet absorber of the present invention comprises the above-described inorganic compound.

Effect of the Invention

The phosphor of the present invention includes an inorganic compound, as a main component, which comprises at least an A element, a D element, an X element, a Li element, and an M element, and further comprises, if necessary, an E element so as to exhibit emission of high brightness as compared to the conventional oxide phosphor or oxynitride phosphor and to be excellent as the white phosphor if the phosphor has a specific crystal structure and composition. Since the brightness of the phosphor does not decrease even when exposed to the excitation source, the present invention provides a useful phosphor suitably used for a light-emitting device such as a white light-emitting diode, an illuminating device, a backlight source for a liquid crystal, VFD, FED, PDP or CRT. Further, the phosphor of the present invention absorbs ultraviolet ray, and thus the phosphor is suitable for a pigment and ultraviolet absorber.

EMBODIMENT FOR CARRYING OUT THE INVENTION

Figure 1:
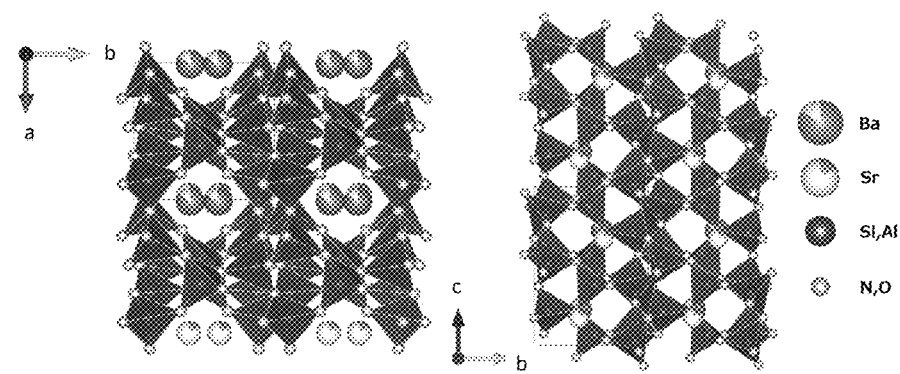
FIG. 1 is a diagram illustrating a crystal structure of Ba$_1$Si$_7$N$_{10}$ crystal.

Hereafter, a phosphor of the present invention is described in detail.

The phosphor of the present invention includes an inorganic compound as a main component, the inorganic compound comprising an inorganic crystal including at least an A element, a D element, and an X element (here A is one or two or more elements selected from the group consisting of Mg, Ca, Sr, and Ba; D is one or two or more elements selected from the group consisting of Si, Ge, Sn, Ti, Zr, and Hf; and X is one or two or more elements selected from the group consisting of O, N, and F), and the inorganic crystal, if necessary, further including an E element (here E is one or two or more elements selected from the group consisting of B, Al, Ga, In, Sc, Y, and La), wherein the inorganic crystal further includes a Li element and an M element (here M is one or two or more elements selected from the group consisting of Mn, Ce, Pr, Nd, Sm, Eu, Tb, Dy, and Yb).

Among the above, the phosphor comprising an inorganic compound in which the Li element and the M element are solid-solved into the above-mentioned inorganic crystal in particular exhibits high emission intensity. Here, the Li solid solution may be realized in a state of an interstitial solid solution or a substitutional solid solution and the phosphor characterized by the interstitial solid solution exhibits white color emission since the interaction between the light-emitting ion and the Li ion would be the stronger in the case of the interstitial solid solution.

The phosphor in which the inorganic crystal is any of (1) a crystal represented by $A_1(D, E)_7X_{10}$, (2) $Sr_1Si_7N_{10}$ crystal or a crystal having the same crystal structure as the $Sr_1Si_7N_{10}$ crystal, and (3) $Ba_1Si_7N_{10}$ crystal or a crystal having the same crystal structure as the $Ba_1Si_7N_{10}$ crystal exhibits in particular hight brightness.

The present inventors found out that (1) a crystal represented by $A_1(D, E)_7X_{10}$ such as $SrSi_7N_{10}$ and $BaSi_7N_{10}$, (2) $Sr_1Si_7N_{10}$ crystal or a crystal having the same crystal structure as the $Sr_1Si_7N_{10}$ crystal, or (3) $Ba_1Si_7N_{10}$ crystal or a crystal having the same crystal structure as the $Ba_1Si_7N_{10}$ crystal could render white color emission by adding at least Li and the M element as the luminescence center element thereto. It is more preferable to add Li and Eu and/or Ce as the M element and Al as the E element to the above-described inorganic crystal such that a phosphor to render white color emission can be provided. Here, $SrSi_7N_{10}$ and $BaSi_7N_{10}$ are the same as $Sr_1Si_7N_{10}$ and $Ba_1Si_7N_{10}$, respectively, but the latter expressly shows the number of Sr or Ba is one while the former is an expression in a general way.

Depending on the composition, the M element represented by Eu and Al and Li having been added thereto could be incorporated into the crystal without changing the crystal structure so much by being solid-solved into $A_1(D, E)_7X_{10}$ crystal. It is considered that the M element could be incorporated into the position of the A element by the substitutional solid solution. It is considered that Al could be incorporated into the position of the D element by the substitutional solid solution. It is considered that Li could be incorporated into a position other than the positions of the A element, the D element, and the E element by the interstitial solid solution. Thus, the M element and Al and Li would be incorporated into the crystal without changing the crystal structure so much.

FIG. 1 is a diagram showing a crystal structure of $Ba_1Si_7N_{10}$ crystal.

$(Ba, Sr)_1(Si, Al)_7(O, N)_{10}:Li^+$ is one of crystals having the same crystal structure as the $Ba_1Si_7N_{10}$ crystal, into which Li is solid-solved, and, according to the single crystal structure analysis performed with respect to the $(Ba, Sr)_1(Si, Al)_7(O, N)_{10}:Li^+$ crystal, the $(Ba, Sr)_1(Si, Al)_7(O, N)_{10}:Li^+$ crystal belongs to the monoclinic crystal system and the $P_c$ space group (space group No. 7 in the International Tables for Crystallography) and has crystal parameters and atomic coordinate positions as shown in Table 1.

Here, the expression of "inorganic crystal:metal element" is an expression to show material in which the metal element is solid-solved into the inorganic crystal such that the expression of $(Ba, Sr)_1(Si, Al)_7(O, N)_{10}:Li^+$ indicates the material in which the monovalent Li is solid-solved into the $(Ba, Sr)_1(Si, Al)_7(O, N)_{10}$ crystal.

$(Ba, Sr)_1(Si, Al)_7(O, N)_{10}:Li^+$ was synthesized as follows. A mixture composition of silicon nitride ($Si_3N_4$), alumun nitride (AlN), lithium nitride ($Li_3N$), strontium nitride ($Sr_3N_2$), and barium nitride ($Ba_3N_2$) was designed to have 2:1:0.667:0.0667:0.2667 in the molar ratio, and the mixture powder was prepared by weighing and mixing raw materials to satisfy the mixture composition, and the mixed mixture powder was fired in similar processes as described later with respect to Example 1.

In Table 1, lattice constants a, b, and c signify respective lengths of the axes of the unit cell, and $\alpha$, $\beta$, and $\gamma$ signify respective angles between axes of the unit cell. The atomic coordinates indicate a position of each atom in the unit cell in terms of a value between 0 and 1 using the unit cell as a unit. According to the analysis results thus obtained, there were atoms of Ba, Sr, Si, Al, N, and O, respectively, and Ba and Sr existed in one kind of site: (Ba, Sr(1)) without distinguishing Ba site from Sr site. According to the analysis results thus obtained, Si and Al occupied seven (7) kinds of sites: (Si, Al(1) to (Si, Al(7)) without distinguishing Si site from Al site. Further, according to the analysis results thus obtained, O and N occupied ten (10) kinds of sites: (O, N(1) to O, N(10)) without distinguishing O site from N site. Also, Li was detected by the ICP mass spectrometry measurement, but the position in the atomic coordinates could not be identified such that it is suggested that Li was solid-solved by the interstitial solid solution. In consideration of the Li:Si:Al ratio and the Ba:Sr ratio determined by the ICP mass spectrometry measurement, and the charge neutrality, the composition of $(Ba,Sr)_1(Si,Al)_7(O,N)_{10}:Li^+$ crystal was represented by $Ba_{0.8}Sr_{0.2}Si_{6.7}Al_{0.3}Li_{0.1}O_{0.2}N_{9.8}$.

TABLE 1

Crystal structure data of $(Ba, Sr)_1(Si, Al)_7(O, N)_{10}$: Li+ crystal

| Crystal composition | | $(Ba, Sr)1(Si, Al)7(O, N)10$: Li+ | |
|---|---|---|---|
| Formula weight (Z) | | 2 | |
| Crystal system | | Monoclinic | |
| Space group | | Pc | |
| Space group number | | 7 | |
| Lattice constants | a | 6.8875 | Å |
| | b | 6.7102 | Å |
| | c | 9.6756 | Å |
| | α | 90 | degree |
| | β | 106.166 | degree |
| | γ | 90 | degree |

| Atom | Atomic coordinate | | | Site occupancy rate |
|---|---|---|---|---|
| Atomic coordinate | x | y | z | |
| Ba, Sr(1) | 0.010439 | 0.401545 | 0.225284 | 1 |
| Si, Al(1) | 0.430123 | 0.526341 | 0.069747 | 1 |
| Si, Al(2) | −0.389034 | 0.526843 | 0.38115 | 1 |
| Si, Al(3) | −0.140364 | 0.895103 | 0.324761 | 1 |
| Si, Al(4) | 0.119404 | 0.875815 | 0.091222 | 1 |
| Si, Al(5) | 0.303493 | 0.133782 | −0.093851 | 1 |
| Si, Al(6) | −0.326296 | 0.118542 | 0.514564 | 1 |
| Si, Al(7) | 0.486111 | 0.128479 | 0.210817 | 1 |
| N, O(1) | 0.399213 | 0.367189 | −0.078594 | 1 |
| N, O(2) | 0.521314 | 0.383004 | 0.224881 | 1 |
| N, O(3) | 0.220507 | 0.657908 | 0.06593 | 1 |
| N, O(4) | −0.352121 | 0.369737 | 0.531602 | 1 |
| N, O(5) | −0.190418 | 0.666716 | 0.380455 | 1 |
| N, O(6) | −0.318248 | −0.000346 | 0.672589 | 1 |
| N, O(7) | 0.262218 | 0.085141 | 0.074009 | 1 |
| N, O(8) | −0.11259 | 0.079242 | 0.459973 | 1 |
| N, O(9) | 0.079533 | 0.112385 | −0.233586 | 1 |
| N, O(10) | −0.530562 | 0.036896 | 0.373421 | 1 |

As a result of analysis using data in Table 1, the $(Ba, Sr)_1(Si, Al)_7 (O,N)_{10}$:Li$^+$ crystal was found to have the structure as shown in FIG. 1, in which a Ba element, a Sr element, and a Li element are included in a skeleton formed by linking tetrahedrons constituted of bonds of Si or Al with O or N. The M element to become an activating ion such as Eu is incorporated into the crystal in the type of partial substitution of the Ba element or the Sr element in the crystal.

As a crystal having a crystal structure identical to the crystal structure of $(Ba, Sr)_1(Si, Al)_7 (O, N)_{10}$:Li$^+$ crystal, which was synthesized and subjected to the structure analysis, there may be included $A_1(D,E)_7X_{10}$ crystal and, more specifically, $A_1(Si, Al)_7 (O,N)_{10}$ crystal, into which Li is solid-solved. The A element is typically Sr or Ba or a mixture of Sr and Ba. With respect to the $A_1(D, E)_7X_{10}$ crystal, A can occupy a site which Ba is supposed to occupy, D and E can occupy a site which Si is supposed to occupy, and X can occupy a site which N is supposed to occupy in the $Ba_1Si_7N_{10}$ crystal. Thus, a relative ratio of numbers of atoms can be adjusted to one (1) for the element A, seven (7) for the sum of D and E, and ten (10) for the sum of X while the crystal structure remains the same. Here, it is desirable to have a ratio of cation such as A, D, and E to anion such as X satisfy the electrical neutrality condition in the crystal. With respect to $A_1(Si, Al)_7 (O, N)_{10}$ crystal, Si and Al can occupy a site which Si is supposed to occupy and O and N can occupy a site which N is supposed to occupy in the $Ba_1Si_7N_{10}$ crystal. Thus, a relative ratio of numbers of atoms can be adjusted to one (1) for the A element, seven (7) for the sum of Si and Ai, and ten (10) for the sum of O and N while the crystal structure remains the same. Here, it is desirable to have a ratio of Si/Al and a ratio of O/N satisfy the electrical neutrality condition in the crystal.

The $Ba_1Si_7N_{10}$ system crystal of the present invention can be identified by means of the X-ray diffraction or the neutron diffraction. A substance exhibiting the identical diffraction to that of the $Ba_1Si_7N_{10}$ system crystal as a result of the X-ray diffraction in the present invention comprises a crystal represented by $A_1(D, E)_7X_{10}$. Further, the substance comprises a crystal in which lattice constants or atomic positions are changed by substituting other elements for constituent elements in the $Ba_1Si_7N_{10}$ crystal. Here, specific examples of materials in which the constituent elements are substituted with other elements comprise a material in which Ba in the $Ba_1Si_7N_{10}$ crystal is partially or completely substituted with the A element other than Ba (here, A is one or two or more kinds of elements selected from the group consisting of Mg, Ca, Sr, and Ba) or the M element (here, M is one or two or more kinds of elements selected from the group consisting of Mn, Ce, Pr, Nd, Sm, Eu, Tb, Dy, and Yb). Further, there are specific examples of materials in which Si in the crystal is partially or completely substituted with the D element excluding Si (here, D is one or two or more kinds of elements selected from the group consisting of Si, Ge, Sn, Ti, Zr, and Hf). Further, there are specific examples of materials in which Si in the crystal is partially substituted with the E element (here, E is one or two or more kinds of elements selected from the group consisting of B, Al, Ga, In, Sc, Y, and La). Further, there are specific examples of materials in which N in the crystal is partially or completely substituted with O or fluorine. These substitutions are performed such that the neutrality of charges in the whole crystal is maintained. It is the $Ba_1Si_7N_{10}$ system crystal that has the unchanged crystal structure as a result of such element substitutions. Since emission characteristics, chemical stability, and thermal stability of the phosphor are changed by the substitution of elements, the substitution of elements may be selectively utilized at an appropriate time for each application thereof as far as the crystal structure remains the same.

In the $Ba_1Si_7N_{10}$ system crystal, the lattice constants change as the constituent components are substituted with other elements or as an activating element such as Eu is solid-solved therein, but the atomic positions given by the crystal structure, sites to be occupied by atoms, and coordinates thereof do not significantly change to an extent in which a chemical bond between skeleton atoms is broken. In the present invention, a crystal structure is defined to be identical to that of the $Ba_1Si_7N_{10}$ crystal if lengths of chemical bonds (distance of neighboring atoms) of Al—N and Si—N calculated from the lattice constants and atomic coordinates obtained by conducting Rietveld analysis of the results from the X-ray diffraction or the neutron diffraction in the space group of Pc are compared with lengths of chemical bonds calculated from the lattice constants and atomic coordinates of the $Ba_1Si_7N_{10}$ crystal as shown in Table 1 such that the difference between the lengths is within ±5%, and using the definition it is determined whether the crystal having the crystal structure belongs to the $Ba_1Si_7N_{10}$ system crystal or not. This determination criterion is employed herein since it was once observed that a crystal in the $Ba_1Si_7N_{10}$ system crystal was changed to become another crystal due to breakage of chemical bonds when lengths of the chemical bonds were changed beyond ±5% according to the prior experiments.

Further, in case an amount of solid-solution is small, a simple method for determining whether it belongs to the $Ba_1Si_7N_{10}$ system crystal or not is described as follows. A new substance can be identified to have the same crystal structure if main peaks of the resultant X-ray diffraction pattern measured with the new substance are respectively located at diffraction peak positions, which agree with the peak positions (2θ) of the diffraction pattern calculated using the crystal structure data of Table 1 and the lattice constants calculated from the resultant X-ray diffraction pattern.

Figure 2:
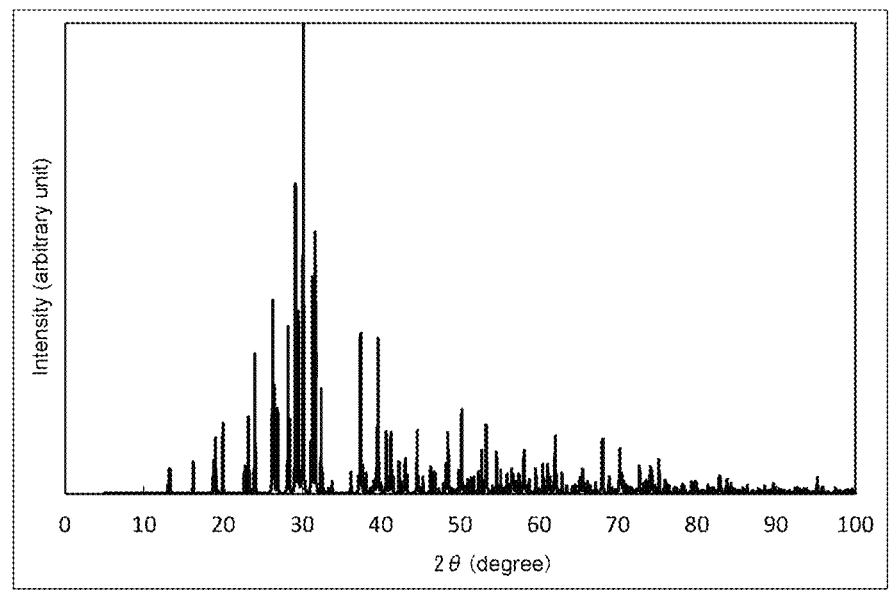
FIG. 2 is a diagram showing a powder X-ray diffraction pattern using Cu Kα-line, calculated from a crystal structure of (Ba, Sr)$_1$(Si, Al)$_7$(O, N)$_{10}$:Li$^+$ crystal.

FIG. 2 is a diagram showing a powder X-ray diffraction pattern using Cu Kα-line calculated from the crystal structure of the $(Ba, Sr)_1(Si, Al)_7(O, N)_{10}:Li^+$ crystal.

Since synthesized compound through an actual synthesis is obtained in a powder state, the spectra of the thus-obtained synthesized compound are compared to those of FIG. 2 and it can be determined whether the synthesized compound belongs to the $Ba_1Si_7N_{10}$ system crystal or not.

It is possible to make a simple determination whether a subject substance belongs to the $Ba_1Si_7N_{10}$ system crystal or not by comparing FIG. 2 and that of the subject substance. It may be good to make a judgment using approximately ten (10) peaks of the highest intensity in the diffraction pattern as the main peaks of the $Ba_1Si_7N_{10}$ system crystal. Table 1 is important in this sense since it could be referenced when the identification of the $Ba_1Si_7N_{10}$ system crystal is conducted. Further, it is also possible to define a crystal structure of the $Ba_1Si_7N_{10}$ system crystal as an approximate structure using another crystal system of the monoclinic crystal and, in such a case, the crystal structure is expressed using a different space group, different lattice constants, and different plane indices, but the X-ray diffraction results (for example, FIG. 2) and the crystal structure (for example, FIG. 1) remain unchanged such that an identification method and an identification result thereof are the same. Therefore, in the present invention, it is to perform an X-ray diffraction analysis using the monoclinic crystal system. The method of identifying the substance based on Table 1 will be concretely described in Examples to be described later, and the explanation of the method described herein is just in general.

A phosphor can be obtained if the $Ba_1Si_7N_{10}$ system crystal is activated by, as the M element, one or two or more kinds of elements selected from the group consisting of Mn, Ce, Pr, Nd, Sm, Eu, Tb, Dy, Ho, Er, Tm, and Yb. Since emission characteristics such as an excitation wavelength, an emission wavelength, and emission intensity may vary depending on the composition of the $Ba_1Si_7N_{10}$ system crystal, and the kind and quantity of the activating element, such conditions may be chosen in accordance with an application thereof.

With respect to the crystal represented by $A_1(D,E)_7X_{10}$, the phosphor in which the A element is one kind of or two kinds of mixture selected from Sr and Ba, the D element is Si, the E element is Al, the X element is N or a mixture of N and O, and the M element is Eu exhibits high emission intensity.

Further, the inorganic crystal represented by $A_1(D, E)_7X_{10}$ or the inorganic crystal having the same crystal structure as the crystal represented by $Ba_1Si_7N_{10}$ belongs the monoclinic system and has the symmetry of space group $P_c$ wherein the lattice constants a, b, and c and the angles α, β, and γ are values in the following ranges:
a=0.68875±0.05 nm,
b=0.67102±0.05 nm,
c=0.96756±0.05 nm,
α=90±1.5 degree,
β=106.17±1.5 degree, and
γ=90±1.5 degree
such that the inorganic crystal is especially stable and the phosphor having such inorganic crystal as the host crystal exhibits high emission intensity. If a crystal is prepared out of the above range, the crystal may become unstable and the emission intensity may occasionally decrease.

The phosphor represented by a composition formula of $L_cM_dA_eD_fE_gX_h$ (here, in the formula, c+d+e+f+g+h=1, L is a Li element, M is one or two or more kinds of elements selected from the group consisting of Mn, Ce, Pr, Nd, Sm, Eu, Tb, Dy, and Yb; A is one or two or more kinds of elements selected from the group consisting of Mg, Ca, Sr, and Ba; D is one or two or more kinds of elements selected from the group consisting of Si, Ge, Sn, Ti, Zr, and Hf; E is one or two or more kinds of elements selected from the group consisting of B, Al, Ga, In, Sc, Y, and La; and X is one or two or more kinds of elements selected from the group consisting of O, N, and F) and having the parameters c, d, e, f, g, and h satisfy all conditions:

$0.001 \leq c \leq 0.7$, $0.00001 \leq d \leq 0.05$, $0.01 \leq e \leq 0.1$, $0.1 \leq f \leq 0.4$, $0 \leq g \leq 0.1$, and $0.15 \leq h \leq 0.65$ in particular exhibits high emission intensity.

The parameter c is a parameter representing a constituent amount of the L element such as Li, and if the amount is less than 0.001 or higher than 0.7, the crystal structure becomes unstable so as to cause the emission intensity to decrease. The parameter d represents an additive amount of the activating element, and if the amount is less than 0.00001, an amount of light-emitting ions is insufficient so as to cause brightness to decrease. If the amount is more than 0.05, the emission intensity may be decreased due to the concentration quenching by a mutual interaction between light-emitting ions. The parameter e is a parameter representing a constituent amount of the alkaline earth element such as Ba, and if the amount is less than 0.01 or higher than 0.1, the crystal structure becomes unstable so as to cause the emission intensity to decrease. The parameter f is a parameter representing a constituent amount of the D element such as Si, and if the amount is less than 0.1 or higher than 0.4, the crystal structure becomes unstable so as to cause the emission intensity to decrease. The parameter g is a parameter representing a constituent amount of the E element such as Al, and if the amount is higher than 0.1, the crystal structure becomes unstable so as to cause the emission intensity to decrease. Preferably, the parameter g is greater than zero (0). Thus, it is possible to cause white color light-emission of high brightness. The parameter h is a parameter representing a constituent amount of the X element such as O, N, and F, and if the amount is less than 0.15 or higher than 0.65, the crystal structure becomes unstable so as to cause the emission intensity to decrease. The element X is an anion, and the composition ratio of O, N, and F is determined in order to maintain the charge neutrality with a cation of the A, M, D and E elements.

A crystal, in which values of the parameters d, e, f, g, and h satisfy all conditions:

$(d+e)/(d+e+f+g)=1/8 \pm 0.014$, is stable in the crystal structure and exhibits particularly high emission intensity. In particular, the crystal, in which the values satisfy all conditions:

$(d+e)/(d+e+f+g)=1/8$, that is to say, the crystal having $(M,A)_1(D, E)_7X_{10}$ composition, is especially stable in the crystal structure and exhibits particularly high emission intensity.

Further, the crystal having the composition, in which the parameters f and g satisfy the condition:

$0.8 \leq f/(f+g) \leq 1.0$, is stable in the crystal structure and exhibits high emission intensity.

The inorganic crystal having the composition, in which the X element comprises N and O and the ratio of h1 and h2 (here, h1+h2=h), which are numbers of N atoms and O atoms contained in the inorganic compound, respectively, satisfies the condition of $0/10 \leq h2/(h2+h1) \leq 2/10$, is stable in the crystal structure and exhibits high emission intensity. In particular, the inorganic crystal having the composition, in which the ratio of h1 and h2 (here, h1+h2=h), which are numbers of N atoms and O atoms contained in the inorganic compound, respectively, may satisfy the condition of $0/10 \leq h2/(h2+h1) \leq 1/10$, is stable in the crystal structure and exhibits high emission intensity.

The inorganic crystal having the composition including at least boron as the E element, in which the value of boron as the parameter g may satisfy the condition of $0.00001 \leq g \leq 0.01$, is stable in the crystal structure and exhibits high emission intensity.

The phosphor, in which a composition formula of the inorganic compound may be represented by $Li_w(Sr, Ba, Eu)_pSi_qAl_zN_sO_t$ using the parameters w, p, q, z, s, and t satisfying:

$q+z=7$, $s+t=10$, and $w+2p+4q+3z=3s+2t$, can keep a stable crystal structure while the ratio of Li/(Sr+Ba+Eu), the ratio of Si/Al, and the ratio of N/O can be changed in the composition range where the parameters w, p, q, z, s, and t are changed. Thus, it is the phosphor that is easy to make a material design since an excitation wavelength thereof or an emission wavelength thereof can be continuously changed by utilizing this feature.

A phosphor, in which an inorganic compound includes single crystal particles or an aggregate of the single crystal particles having a mean particle diameter of 0.1 μm or more and 100 μm or less has high emission efficiency and a good handling property when it is applied to an LED such that it is good to control the particle diameter thereof in this range.

Impurity elements of Fe, Co, and Ni included in the inorganic compound may cause the emission intensity to decrease. If the sum of these impurity elements in the phosphor is controlled to be 500 ppm or less, an influence of these elements on the emission intensity is decreased.

As one of embodiments of the present invention, the phosphor of the present invention may further comprise an amorphous phase or another crystal phase in addition to the inorganic compound, in which the Li element and the M element are solid-solved into the above-described $Ba_1Si_7N_{10}$ system crystal as the host crystal, and the content amount of the above-mentioned inorganic compound is equal to or more than 20 mass %. In the case where the phosphor of the present invention cannot obtain the target property with the above-mentioned inorganic compound only or where a function such as a conductive property is provided thereto, the present embodiment may be employed. The content amount of the above-mentioned inorganic compound may be adjusted in accordance with the target property, but the emission intensity could be lowered if the amount is less than 20 mass %. In view of this, with respect to the phosphor including the inorganic compound as the main component, which comprises the $Ba_1Si_7N_{10}$ system crystal of the present invention as the host crystal, the amount of the main component is equal to or more than 20 mass %.

In the case where the phosphor of the present invention is supposed to need electrical conductivity in an application in which electron beam excitation or the like is employed, an inorganic substance having electrical conductivity may be added thereto as another crystal phase or an amorphous phase.

As the inorganic substance having the electrical conductivity, oxide; oxynitride; or nitride of one or two or more kinds of elements selected from the group consisting of Zn, Al, Ga, In, and Sn, or a mixture of any of these may be named. For example, zinc oxide, aluminum nitride, indium nitride, tin oxide, and so on may be named.

In the case where the target emission spectrum cannot be obtained by a single inorganic compound (hereinafter referred to as the phosphor of the $Ba_1Si_7N_{10}$ system crystal for simplicity) comprising the above-described $Ba_1Si_7N_{10}$ system crystal as the host crystal, into which the Li element and the M element are solid-solved, a second phosphor may be added thereto. As an example of the second phosphor, a BAM phosphor, a β-sialon phosphor, an α-sialon phosphor, a $(Sr, Ba)_2Si_5N_8$ phosphor, a $CaAlSiN_3$ phosphor, and a $(Ca, Sr)AlSiN_3$ phosphor may be named. These inorganic phosphors may be utilized as the above-described other crystal phase or amorphous phase.

As one of the embodiments of the present invention, there is a phosphor having a peak at a wavelength in the range of 470 nm to 620 nm upon irradiation by an excitation source. For example, a phosphor of the $B_{ai}Si_7N_{10}$ system crystal in which Eu is activated has an emission peak in this range by adjusting the composition.

As one of the embodiments of the present invention, there is a phosphor emitting light by the excitation source comprising vacuum ultraviolet light, ultraviolet light, or visible light having a wavelength of 100 nm or more to 450 nm or less, or electron beam or X-ray. The phosphor can be made to emit light efficiently by using such excitation sources.

As one of the embodiments of the present invention, there is a phosphor comprising, as the main component, an inorganic compound comprising a crystal represented by $A_1(D, E)_7X_{10}$ or an inorganic crystal having the same crystal structure as the crystal represented by $Ba_1Si_7N_{10}$, into which Li and Eu are solid-solved. Since the phosphor emits white color fluorescence of at least 470 nm and not exceeding 620 nm by adjusting the composition upon irradiatation of light from 100 nm to 410 nm, the phosphor is desiable for use in a white color emission application such as a white color LED.

As one of the embodiments of the present invention, there is a phosphor, upon irradiation by the excitation source, to emit light of a specific color which satisfies, in terms of values of (x, y) of CIE 1931 chromaticity coordinates, conditions:

$0.25 \le x \le 0.45$; and $0.25 \le y \le 0.45$.

For example, a phosphor to emit light of color in this range in the chromaticity coordinates can be obtained by adjusting the composition represented by

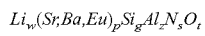

where $q+z=7$, $s+t=10$, and $w+2p+4q+3z=3s+2t$.

The phosphor may be applied for the white color emission of the white color LED and the like.

As one of the embodiments of the present invention, there is a phosphor into which Li and Al and Eu are solid-solved into $Ba_1Si_7N_{10}$ crystal, upon irradiation of light of 280 nm to 410 nm, to emit light having chromaticity where the values of (x, y) of CIE 1931 chromaticity coordinates are in the ranges of:
$0.25 \le x \le 0.45$ and
$0.25 \le y \le 0.45$.
The phosphor may be preferably applied for white color emission of the white color LED or the like.

Thus, as compared to an ordinary oxide phosphor or an existing sialon phosphor, the phosphor of the present invention is characterized by having a wider excitation range of an electron beam and X-ray and light from ultraviolet light to visible light, emitting light of white color, and, in particular, both emitting light of a white color from 470 nm to 620 nm with a specific composition thereof and being capable of adjusting an emission wavelength and an emission peak width. Thus, the phosphor of the present invention is suitable for an illuminating device, an image display device, pigment, and an ultraviolet absorber because of such emission characteristics. The phosphor of the present invention has also advantages of excellent heat resistance since it does not degrade even if it is exposed to a high temperature, and has excellent long-term stability under an oxidizing atmosphere and a moisture environment, such that a product having excellent durability can be provided by utilizing the phosphor.

A method of manufacturing such a phosphor of the present invention is not particularly limited, but, for example, a mixture of metal compounds being a raw material mixture that can constitute the phosphor of the $Ba_1Si_7N_{10}$ system crystal is fired in a nitrogen-containing inert atmosphere in the temperature range of 1,200° C. or higher to 2,200° C. or lower so as to obtain the phosphor of the present invention. While the main crystal of the present invention belongs to the monoclinic system and the space group $P_c$, another crystal that belongs to another crystal system and another space group other than the above may be occasionally mixed therein depending on synthesis conditions such as firing temperature. However, even in such a case, a change of the emission characteristics is slight and therefore the thus-obtained product can be used to render high brightness emission.

As a starting raw material, byway of example, a mixture of metal compounds may comprise: a compound including Li, a compound including M, a compound including A, a compound including D, a compound including E if necessary, and a compound including X, (here, M is one or two or more kinds of elements selected from a group consisting of Mn, Ce, Pr, Nd, Sm, Eu, Tb, Dy, and Yb; A is one or two or more kinds of elements selected from a group consisting of Mg, Ca, Sr, and Ba; D is one or two or more kinds of elements selected from a group consisting of Si, Ge, Sn, Ti, Zr, and Hf; E is one or two or more kinds of elements selected from a group consisting of B, Al, Ga, In, Sc, Y, and La; and X is one or two or more kinds of elements selected from a group consisting of O, N, and F).

As the starting material, the mixture, which comprises the compound including M that is a single substance or a mixture of at least two kinds of substances selected from metal, silicide, oxide, carbonate, nitride, oxynitride, chloride, fluoride, or oxyfluoride including M; the compound including A that is a single substance or a mixture of at least two kinds of substances selected from metal, silicide, oxide, carbonate, nitride, oxynitride, chloride, fluoride, or oxyfluoride including A; and the compound including D that is a single substance or a mixture of at least two kinds of substances selected from a metal, silicide, oxide, carbonate, nitride, oxynitride, chloride, fluoride or oxyfluoride including D, is preferable because these raw materials are easily available and have excellent stability. If the compound including X is a single substance or a mixture of at least two kinds of substances selected from the group consisting of X-containing oxide, nitride, oxynitride, fluoride, and oxyfluoride, it is preferable since the raw material is easily available and has excellent stability. If the compound including E is a single substance or a mixture of at least two kinds of substances selected from the group consisting of E-containing metal, silicide, oxide, carbonate, nitride, oxynitride, chloride, fluoride, and oxyfluoride, it is preferable since the raw material is easily available and has excellent stability.

As the starting raw material, if the compound including Li is a single substance or a mixture of at least two kinds of substances selected from the group consisting of Li-containing metal, nitride of Li, oxide of Li, chrolide of Li, and fluoride of Li, it is desirable since the raw material is easily available and has excellent stability.

In the case where a phosphor of the $Ba_1Si_7N_{10}$ system crystal activated by Eu is manufactured, it is preferable to use a starting material comprising, at least, nitride or oxide of europium; nitride, oxide, or carbonate of barium; silicon oxide or silicon nitride; and nitride of Li since the reaction tends to easily proceed during the firing.

Since the firing temperature is high and the firing atmosphere is an inert atmosphere containing nitrogen, an electric furnace of a metal resistance heating type or a graphite resistance heating type, in which a high temperature member of the furnace made of carbon is used, is suitable as a furnace for firing. The nitrogen-containing inert atmosphere in the pressure range of 0.1 MPa or more to 100 MPa or less is preferable because thermal decomposition of nitride or oxynitride of the starting material or the product is suppressed. It is preferable that the oxygen partial pressure is 0.0001% or lower in the firing atmosphere in order to suppress the oxidation reaction of nitride or oxynitride of the starting material or the product.

Here, the firing time is, although it differs depending on the firing temperature, usually 1 to 10 hours or so.

Various kinds of heat-resistant materials can be used for the container containing the raw material compound in firing the raw material mixture. However, in view of a low adverse effect of material deterioration on the metal nitride used in the present invention, a material suitably includes a boron nitride coated container, which is exemplified by a boron nitride coated graphite crucible used for synthesis of an α-sialon as described in a scientific journal "Journal of the American Ceramic Society" Vol. 85, No. 5, pages 1229 to 1234 in 2002, or boron nitride sintered body. When the firing is performed under such conditions, boron or boron nitride component is mixed into the product from the container, but, if the amount thereof is small, an effect of mixing is slight since the emission characteristics are not deteriorated. Further, durability of the product may be occasionally improved by the addition of a small amount of boron nitride thereto, and such addition may be preferable in some cases.

In order to manufacture the phosphor of the present invention in the form of powder or aggregate, it is preferable to utilize a method of firing raw materials after the raw materials are filled in a container with a filling rate kept at the bulk density of 40% or lower. It is possible to prevent particles from adhering with each other by maintaining the bulk density of 40% or lower in the filling rate. Here, the term relative bulk density means the ratio of a value (bulk density) given by dividing the mass of powder material filled in the container by the capacity of the container to the real density of the substance of the powder material. Unless otherwise noted in the present specification, the relative bulk density is referred to as simply the bulk density.

In order to manufacture the phosphor of the present invention in the form of powder or aggregate, it is preferable to make the mean particle diameter of powder particles or aggregate of the raw material equal to or less than 500 µm since the raw material has excellent reactivity and handling characteristics.

As a method of adjusting a particle size of the particles or aggregates to be 500 µm or less, it is preferable to employ a spray dryer, sieving, or pneumatic classification since such a method has excellent operating efficiency and handling characteristics.

As a method of firing, not the hot-pressing, but a method of firing, in which no external mechanical pressing is applied, such as pressureless sintering method and gas pressure sintering method is preferable as a method of obtaining a product of powder or aggregate.

In the case where the phosphor of the present invention synthesized by firing is a phosphor in a powder state (phosphor powder), a mean particle diameter of the phosphor powder is preferably 50 nm or more and 200 µm or less in terms of a volume-based median diameter (d50) because the emission intensity is high. The volume-based mean particle diameter can be measured, for example, by a Microtrac or a laser light scattering method. A mean particle diameter of phosphor powder synthesized by firing may be satisfactorily adjusted to be at least 50 nm and not exceeding 200 µm by applying at least one technique selected from pulverization, classification, and acid treatment.

Defects included in the powder and damages caused by pulverization may be occasionally cured by heat-treating the phosphor powder after firing, the phosphor powder after pulverizing treatment, or the phosphor powder after controlling a particle size at a temperature of 1,000° C. or higher to the firing temperature or lower. The defects and damages may occasionally cause a decrease in the emission intensity, and in such a case, the emission intensity may be recovered by the heat treatment.

During firing for synthesis of the phosphor of the present invention, a stable crystal may be occasionally obtained by adding an inorganic compound forming a liquid phase at a temperature of a firing temperature or lower and firing a mixture thereof such that the liquid phase acts as a flux to promote the reaction and particle growth, and thus the emission intensity may be occasionally improved.

Specific examples of the inorganic compound forming the liquid phase at the temperature of the firing temperature or lower include a single substance or a mixture of two or more kinds of fluoride, chloride, iodide, bromide, or phosphate of one or two or more kinds of elements selected from the group consisting of Li, Na, K, Mg, Ca, Sr, and Ba. The inorganic compounds have different melting points, respectively, and therefore may be satisfactorily used properly depending on a synthesizing temperature.

Further, the emission intensity of the phosphor of the present invention may occasionally become high by reducing the content amount of the inorganic compound forming the liquid phase at the temperature of the firing temperature or lower by washing the phosphor with a solvent after the firing.

When the phosphor of the present invention is used in an application of a light-emitting device or the like, it is preferable to use the phosphor dispersed in a liquid medium. And the phosphor can be used as the phosphor mixture including the phosphor of the present invention. A composition prepared by dispersing the phosphor of the present invention in the liquid medium is referred to as a phosphor-containing composition.

As the liquid medium that can be used for the phosphor-containing composition of the present invention, any liquid medium can be selected depending on a purpose or the like, if the liquid medium shows liquid properties under desired use conditions to suitably disperse the phosphor of the present invention, and simultaneously does not cause an undesirable reaction or the like. As examples of the liquid medium, an addition reaction type silicone resin and a condensation reaction type silicone resin before curing, a modified silicone resin, an epoxy resin, a polyvinyl resin, a polyethylene resin, a polypropylene resin, a polyester resin, and so on are named. With respect to the liquid media, a single kind of liquid medium may be used by itself, or any combination of two or more kinds of liquid media with any combination ratio thereof may be used.

An amount of used liquid medium or media may be appropriately adjusted depending on an application or the like. In general, the amount is in the range of generally 3 wt % or more and preferably 5 wt % or more, to generally 30 wt % or less and preferably 15 wt % or less in terms of the weight ratio of the liquid medium to the phosphor of the present invention.

Further, the phosphor-containing composition of the present invention may contain, in addition to the phosphor of the present invention and the liquid medium, any other component depending on an application or the like. As examples of the other component, a dispersing agent, a thickening agent, an extending agent, a buffering agent, and so on are named. Specifically, silica fine powder such as Aerosil, alumina, and so on may be named.

The light-emitting device of the present invention is configured by using at least an excitation light-emitting body or an emission source, and the phosphor of the present invention.

As the excitation light-emitting body or the emission source, there are an LED light-emitting device, a laser diode light-emitting device, an electroluminescence (EL) light-emitting device, a fluorescent lamp, and so on. The LED light-emitting device can be manufactured using the phosphor of the present invention and by a publicly known method which is described in Japanese Patent Application Publication No. H05(1993)-152609, Japanese Patent Application Publication No. H07(1995)-99345, Japanese Patent No. 2927279, or the like. In this case, the light-emitting body or the emission source is preferably what emits light of a wavelength from 330 to 500 nm. In particular, an LED light-emitting element emitting an ultraviolet (or violet) ray of a wavelength from 330 to 420 nm, or an LED light-emitting element emitting blue light in a wavelength from 420 to 500 nm is preferable. Such LED light-emitting elements include a nitride semiconductor such as GaN or InGaN, which can be an emission source of a predetermined wavelength by adjusting the composition.

As a light-emitting device of the present invention, there are a white color light-emitting diode, an illuminating device including a plurality of white color light-emitting diodes or a backlight for a liquid crystal panel, and the like, which include the phosphor of the present invention, respectively.

In such light-emitting devices, in addition to the phosphor of the present invention, the device may further include one or two or more kinds of phosphor selected from β-sialon phosphor activated with Eu, α-sialon yellow phosphor activated with Eu, $Sr_2Si_5N_8$ orange phosphor activated with Eu, (Ca, Sr) $AlSiN_3$ orange phosphor activated with Eu, and $CaAlSiN_3$ red phosphor activated with Eu. As the yellow phosphor other than the above, for example, YAG:Ce, (Ca, Sr, Ba)$Si_2O_2N_2$:Eu, and the like may be used.

As one aspect of the light-emitting device of the present invention, there is a light-emitting device to emit light having chromaticity where the values of (x, y) of CIE 1931 chromaticity coordinates, which are emitted by the phosphor of the present invention, are in the ranges of:
$0.25 \leq x \leq 0.45$ and
$0.25 \leq y \leq 0.45$
while the excitation light-emitting body or the emission source emits ultraviolet or visible light having a peak wavelength of 300 to 410 nm.

As one aspect of the light-emitting device of the present invention, in addition to the phosphor of the present invention, a blue color phosphor emitting light having a peak wavelength of 450 nm to 500 nm or less by means of the excitation light-emitting body or the emission source can further be included. As examples of such a blue phosphor, there are AlN: (Eu, Si), $BaMgAl_{10}O_{17}$:Eu, $SrSi_9Al_{19}O_{31}$:Eu, $LaSi_9Al_{19}N_{32}$:Eu, α-sialon:Ce, JEM:Ce, and so on. As described above, the expression of "inorganic crystal:metal element" is an expression to show material in which the metal element is solid-solved into the inorganic crystal such that the expression of AlN: (Eu, Si) indicates the material in which Eu and Si are solid-solved into the AlN crystal.

As one aspect of the light-emitting device of the present invention, in addition to the phosphor of the present invention, a green phosphor emitting light having a peak wavelength of at least 500 nm and not exceeding 550 nm by means of the light-emitting body or the emission source can further be included. As examples of such a green phosphor, there are β-sialon:Eu, (Ba, Sr, Ca, Mg)$_2SiO_4$:Eu, (Ca, Sr, Ba)$Si_2O_2N_2$:Eu, and so on.

As one aspect of the light-emitting device of the present invention, in addition to the phosphor of the present invention, a yellow phosphor emitting light having a peak wavelength of at least 550 nm and not exceeding 600 nm by means of the light-emitting body or the emission source can further be included. Specific examples of such a yellow phosphor include YAG: Ce, α-sialon:Eu, $CaAlSiN_3$:Ce, $La_3Si_6N_{11}$:Ce, and so on.

As one aspect of the light-emitting device of the present invention, in addition to the phosphor of the present invention, a red phosphor emitting light having a peak wavelength of at least 600 nm and not exceeding 700 nm by means of the light-emitting body or the emission source can further be included. As examples of such a red phosphor, there are $CaAlSiN_3$:Eu, (Ca, Sr) $AlSiN_3$:Eu, $Ca_2Si_5N_8$:Eu, $Sr_2Si_5N_8$:Eu, and so on.

As one aspect of the light-emitting device of the present invention, a light-emitting device with high efficiency can be configured since the emission efficiency is high if an LED in which the light-emitting body or the emission source emits light having a wavelength of 300 to 410 nm is used.

As one aspect of the light-emitting device of the present invention, there is a light-emitting device having a short wavelength light absorbing material to absorb light of 410 nm or less and to transmit light of 420 nm or more.

The image display device of the present invention is constituted of at least an excitation source and the phosphor of the present invention and includes a fluorescent display tube (VFD), a field emission display (FED), a plasma display panel (PDP), a cathode-ray tube (CRT), and the like. It has been confirmed that the phosphor of the present invention emits light by excitation of a vacuum ultraviolet ray of 100 to 190 nm, an ultraviolet ray of 190 to 380 nm, an electron beam, or the like, and the above image display devices can be configured by combining these excitation sources and the phosphors of the present invention.

The phosphor comprising an inorganic compound crystal phase having a specific chemical composition according to the present invention has a white color as an object color, and thus can be used as a pigment or fluorescent pigment. That is, the object color of white is observed when the phosphor of the present invention is irradiated with sunlight or light from a fluorescent lamp or the like. In view of a good coloring and no degradation over a long period of time, the phosphor of the present invention is suitable for an inorganic pigment. Therefore, when the phosphor of the present invention is used for a paint, ink, color, glaze, colorant to be added to a plastic product or the like, a favorable coloring can be maintained at a high level for a long period of time.

The phosphor of the present invention absorbs ultraviolet ray so as to be suitable also as the ultraviolet absorber. Thus, when the phosphor of the present invention is used as the paint or applied onto a surface of the plastic product or kneaded into an inside thereof, a shielding effect thereof against the ultraviolet ray is so high that the product may be effectively protected from the ultraviolet degradation.

EXAMPLES

The present invention will be described in more detail with reference to the examples to be shown below, but these examples are disclosed only for the purpose of facilitating understanding of the present invention readily such that the present invention is not limited to these examples.

Raw Materials Used for Synthesis

The raw material powders used for the synthesis were: silicon nitride powder with a particle size of specific surface area of 11.2 m$^2$/g, oxygen content of 1.29 wt %, and α type content of 95% (SN-E10 grade; made by Ube Industries, Ltd.); aluminum nitride powder with a particle size of specific surface area of 3.3 m$^2$/g and oxygen content of 0.82 wt % (E grade made by Tokuyama Corporation); lithium nitride (made by Kojundo Chemical Laboratory Co., Ltd.); strontium nitride of 99.5% purity (Sr$_3$N$_2$; made by Materion Advanced Chemicals); barium nitride of 99.5% purity (Ba$_3$N$_2$; made by Materion Advanced Chemicals); celium nitride (CeN; manufactured by nitriding by heating metal cerium in the nitrogen flow at 600° C.); and europium nitride (EuN; synthesized by heating metal europium in the nitrogen flow at 800° C.).

Example 1

Synthesis and Structure Analysis of Single Crystal

Silicon nitride (Si$_3$N$_4$); aluminum nitride (AlN); lithium nitride (Li$_3$N); strontium nitride (Sr$_3$N$_2$); barium nitride (Ba$_3$N$_2$), and europium nitride (EuN) were mixed in the molar ratio of 2.33:1:0.667:0.5:0.133:0.1 such that a mixture composition thereof was designed. These raw material powders were weighed to make the above mixture composition and the mixture raw material powders were mixed for 5 minutes using a pestle and a mortar made of silicon nitride sintered body in a nitrogen atmosphere including the oxygen content and the moisture content of not-exceeding 1 ppm in a glovebox. Next, the thus-obtained powder mixture was fed into a crucible made of sintered boron nitride body. A bulk density of the powder mixture (powder-like body) was approximately 33%.

The crucible containing the powder mixture was set into an electric furnace of a graphite resistance heating type. In the firing operation, first the firing atmosphere was made vacuum of 1×10$^{-1}$ Pa or less with a diffusion pump, and heated from the room temperature to 800° C. at a rate of 500° C. per hour. Nitrogen of 99.999 vol % purity was introduced at 800° C. to raise the pressure inside the furnace to 1 MPa, and the temperature was further raised to 1,900° C. at a rate of 500° C. per hour, and then the temperature was maintained for two (2) hours.

The synthesized compound was observed with the microscope to find the synthesized compound was a mixture including a single crystal and other phases. From the synthesized compound, a single crystal particle having a size of 49 μm×65 μm×97 μm was picked up. The crystal particle was analyzed using a scanning electron microscope (SEM; SU1510 made by Hitachi High-Technologies Corp.) equipped with an energy dispersive elemental analyzer (EDS; QUANTAX made by Bruker AXS Inc.) so as to perform the elemental analysis for the elements included in the crystal particle. As a result, presence of Ba, Sr, Si, Al, Eu, O, and N elements was confirmed. Here, it is plausible that the detected O element was caused by a micro amount of oxygen contained in the raw material powders.

Next, the crystal was fixed to a tip top of a glass fiber with an organic adhesive. An X-ray diffraction measurement of the crystal was performed under a condition in which an output of an X-ray source was 50 kV and 50 mA using a single crystal X-ray diffractometer with a rotating target of Mo Kα-line (SMART APEX II Ultra made by Bruker AXS Inc.). As a result, the crystal particle was confirmed to be a single crystal.

Next, the crystal structure was determined using a single crystal structure analysis software (APEX2 made by Bruker AXS Inc.) from the results of X-ray diffraction measurement. The thus-obtained crystal structure data and the crystal structure are consistent to those of Table 1 and FIG. 1, respectively.

It was found that this crystal belonged to the monoclinic crystal system (monoclinic) and belonged to the space group P$_c$ (space group No. 7 of the International Tables for Crystallography), that the lattice constants a, b, and c were determined as follows:

a=0.68875 nm; b=0.67102 nm; and c=0.96756 nm, and that
 the angles α, β, and γ were determined as follows:
angle α=90°; β=109.166°; and γ=90°.

Further, the atom positions were determined as shown in Table 1. Also, while oxygen and nitrogen can occupy the seats that X can occupy in the sialon system crystal in general, since Ba is divalent (+2), Sr is divalent (+2), Si is quadrivalent (+4), Al is triad (+3), and Eu is divalent (+2), if the atomic positions and the amount ratio of Ba, Sr, Si, Al, and Eu are given, the ratio of O and N which occupy (O, N) positions can be determined from the condition of the electrical neutrality of the crystal.

The Li in the crystal was analyzed by the ICP mass spectrometry equipped with a Laser ablation. The sample was irradiated with laser light of the wavelength of 213 nm with a beam diameter of 30 μm emitted by the Nd:YAG laser made by New Wave Research, Inc. and the Li element sublimated from the sample was analyzed by the ICP mass spectrometer. As a result, it was confirmed that the sample contained Li. The crystal obtained from the ratio of Li:Ba:Sr:Si:Al:Eu based on the measured values of the EDS and the ICP and the crystal structure data was (Ba, Sr, Eu)$_1$Si$_{6.7}$Al$_{0.3}$Li$_{0.1}$O$_{0.2}$N$_{9.8}$, and a sinble crystal in which Li was solid-solved into (Ba, Sr, Eu)$_1$(Si, Al)$_7$(O, N)$_{10}$ as one of the crystals having the same crystal structure as the Ba$_1$Si$_7$N$_{10}$ crystal. Here, the reason why the composition of the starting raw material differed from the crystal composition is that a small amount of another composition other than (Ba, Sr, Eu)$_1$Si$_{6.7}$Al$_{0.3}$Li$_{0.1}$O$_{0.2}$N$_{9.8}$ was generated as the second phase, but the present measurement was conducted with the single crystal such that the analysis result indicates the pure (Ba, Sr, Eu)$_1$Si$_{6.7}$Al$_{0.3}$Li$_{0.1}$O$_{0.2}$N$_{9.8}$ structure.

Figure 3:
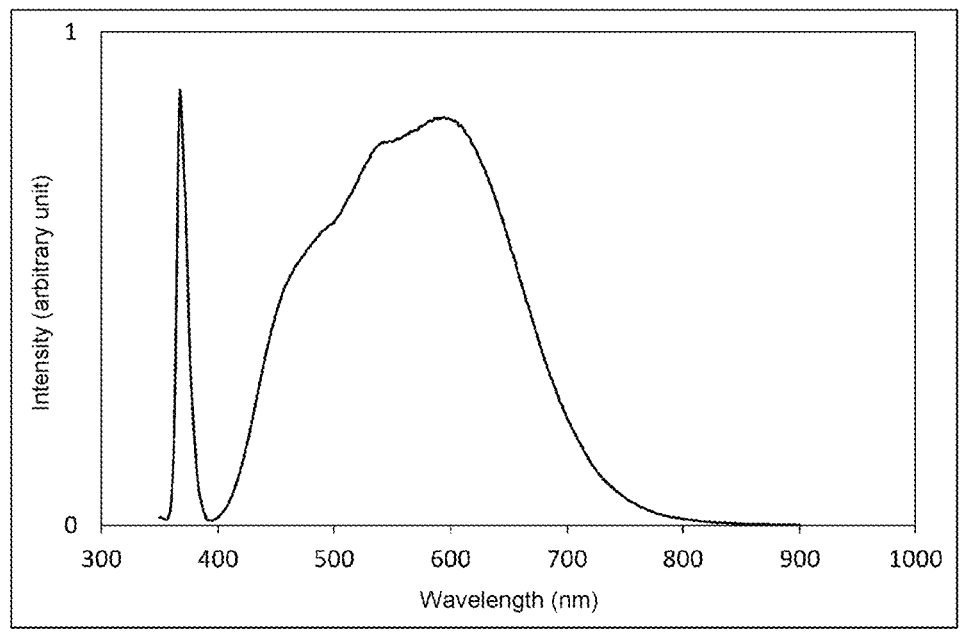
FIG. 3 is a diagram showing an emission spectrum of (Ba, Sr, Eu)$_1$(Si, Al)$_7$(O, N)$_{10}$:Li$^+$ single crystal particle.

FIG. 3 is a diagram showing an emission spectrum of (Ba, Sr, Eu)$_1$(Si, Al)$_7$(O, N)$_{10}$:Li$^+$ single crystal particle.

Emission of white color was observed when the light of 365 nm was irradiated onto the present sample. As shown in FIG. 3, it is understood that the emission spectrum has a peak in a range of 470 nm or more to 620 nm or less. The chromaticity of CIE1931 calculated from the spectrum was x=0.38 and y=0.40.

As mentioned above, it was confirmed that the present sample was a phosphor in which Li and Eu were solid-solved into the Ba$_1$Si$_7$N$_{10}$ system crystal and the phosphor emitted light of white color in which the chromaticity of CIE1931 indicated x=0.38 and Y=0.40 upon irradiation of ultraviolet ray of 365 nm.

As similar compositions thereof were examined, the Ba$_1$Si$_7$N$_{10}$ crystal was found to allow Sr to substitute partially or entirely Ba while the crystal structure remains the same. That is, the crystal of A$_1$Si$_7$N$_{10}$ (A is one or two kinds of elements selected from Ba, Sr, or a mixture thereof) has the same crystal structure as the $Ba_1Si_7N_{10}$ crystal. Further, with respect to this crystal, it was confirmed that Al could substitute partially Si and oxygen could substitute partially N, and that the crystal was one of the compositions of the crystal groups having the crystal structure identical to that of $Ba_1Si_7N_{10}$. It was also expressed by the composition represented by $Li_w(Sr, Ba, Eu)_pSi_qAl_zN_sO_t$ using the parameters w, p, q, z, s, and t satisfying $q+z=7$, $s+t=10$, and $w+2p+4q+3z=3s+2t$, and satisfying the condition of the electrical neutrality.

Example 2 to Example 14 and Comparative Example

According to the design compositions as shown in Tables 2 and 3, raw materials were weighed to be mixture compositions (mole fractions) as shown in Table 4. Although there may be a case in which a design composition in Tables 2 and 3 and a corresponding mixture composition in Table 4 show difference in the composition depending on the kind of each raw material to be used, the mixture composition was determined such that the amount of each metal ion matches therebetween in such a case. These raw material powders were weighed to make the above mixture composition and the mixture raw material powders were mixed for 5 minutes using a pestle and a mortar made of silicon nitride sintered body in a nitrogen atmosphere including the oxygen content and the moisture content of not-exceeding 1 ppm in a glovebox. Next, the thus-obtained powder mixture was fed into a crucible made of sintered boron nitride body. The bulk density of the mixture powder (powder body) was about 33%.

The crucible containing the powder mixture was set into an electric furnace of a graphite resistance heating type. The firing conditions are shown in Table 5. In the firing operation, first the firing atmosphere was made vacuum of $1\times10^{-1}$ Pa or less with a diffusion pump, and heated from the room temperature to 800° C. at a rate of 500° C. per hour. Nitrogen of 99.999 vol % purity was introduced at 800° C. to raise the pressure inside the furnace to 1 MPa, and the temperature was further raised to the predetermined temperature at a rate of 500° C. per hour, and then the temperature was maintained for the predetermined time.

TABLE 2

Design compositions (atomic ratios) in examples and comparative example

| Example | | M element | L element Li | A element Sr | Ba | D element Si | E element Al | X element N |
|---|---|---|---|---|---|---|---|---|
| Comparative example | 1 | Eu | 0.02 | | 0.98 | 7 | | 10 |
| Example | 2 | Eu | 0.2 | 3 | | 0.8 | 6.4 | 0.6 | 10 |
| Example | 3 | Eu | 0.2 | 9 | | 0.8 | 6.4 | 0.6 | 13 |
| Example | 4 | Ce | 0.1 | 9 | | 0.9 | 6.4 | 0.6 | 13 |
| Example | 5 | Eu, Ce | 0.2 | 9 | | 0.8 | 6.4 | 0.6 | 13 |
| Example | 6 | Eu | 0.2 | 3 | | 0.8 | 6.4 | 0.6 | 10 |
| Example | 7 | Eu | 0.2 | 9 | | 0.8 | 6.4 | 0.6 | 13 |
| Example | 8 | Eu | 0.2 | 30 | | 0.8 | 5.8 | 1.2 | 20 |
| Example | 9 | Ce | 0.1 | 9 | | 0.9 | 6.4 | 0.6 | 13 |
| Example | 10 | Eu, Ce | 0.2 | 9 | | 0.8 | 6.4 | 0.6 | 13 |
| Example | 11 | Ce | 0.2 | 9 | | 0.8 | 6.4 | 0.6 | 13 |
| Example | 12 | Eu | 0.1 | 2 | 0.95 | 0.95 | 7 | 1 | 12 |
| Example | 13 | Eu | 0.1 | 2 | 1.5 | 0.4 | 7 | 1 | 12 |
| Example | 14 | Eu | 0.05 | 0.8 | | 0.95 | 6.3 | 0.7 | 10 |

TABLE 3

Design compositions (parameters) in examples and comparative example

| Example | | M element | L element Li | A element Sr | Ba | D element Si | E element Al | X element N |
|---|---|---|---|---|---|---|---|---|
| Comparative example | 1 | Eu | 0.001111 | | 0.054444 | 0.388889 | | 0.555556 |
| Example | 2 | Eu | 0.009524 | 0.142857 | | 0.038095 | 0.304762 | 0.028571 | 0.47619 |
| Example | 3 | Eu | 0.006667 | 0.3 | | 0.026667 | 0.213333 | 0.02 | 0.433333 |
| Example | 4 | Ce | 0.003333 | 0.3 | | 0.03 | 0.213333 | 0.02 | 0.433333 |
| Example | 5 | Eu, Ce | 0.006667 | 0.3 | | 0.026667 | 0.213333 | 0.02 | 0.433333 |
| Example | 6 | Eu | 0.009524 | 0.142857 | | 0.038095 | 0.304762 | 0.028571 | 0.47619 |
| Example | 7 | Eu | 0.006667 | 0.3 | | 0.026667 | 0.213333 | 0.02 | 0.433333 |
| Example | 8 | Eu | 0.003448 | 0.517241 | | 0.013793 | 0.1 | 0.02069 | 0.344828 |
| Example | 9 | Ce | 0.003333 | 0.3 | | 0.03 | 0.213333 | 0.02 | 0.433333 |
| Example | 10 | Eu, Ce | 0.006667 | 0.3 | | 0.026667 | 0.213333 | 0.02 | 0.433333 |
| Example | 11 | Ce | 0.006667 | 0.3 | | 0.026667 | 0.213333 | 0.02 | 0.433333 |
| Example | 12 | Eu | 0.004167 | 0.083333 | 0.039583 | 0.039583 | 0.291667 | 0.041667 | 0.5 |
| Example | 13 | Eu | 0.004167 | 0.083333 | 0.0625 | 0.016667 | 0.291667 | 0.041667 | 0.5 |
| Example | 14 | Eu | 0.00266 | 0.042553 | | 0.050532 | 0.335106 | 0.037234 | 0.531915 |

TABLE 4

Raw material mixture compositions (mass ratios) in examples and comparative example

| Example | | Si3N4 | AlN | Li3N | Ba3N2 | Sr3N2 | CeN | EuN |
|---|---|---|---|---|---|---|---|---|
| Comparative example | 1 | 69.00 | | | 30.30 | | | 0.70 |
| Example | 2 | 58.91 | 4.70 | 6.84 | 23.04 | | | 6.52 |
| Example | 3 | 51.82 | 4.13 | 18.05 | 20.26 | | | 5.73 |
| Example | 4 | 52.10 | 4.15 | 18.15 | 22.92 | | 2.68 | |
| Example | 5 | 51.93 | 4.14 | 18.09 | 20.31 | | 2.67 | 2.87 |
| Example | 6 | 58.91 | 4.70 | 6.84 | 23.04 | | | 6.52 |
| Example | 7 | 51.82 | 4.13 | 18.05 | 20.26 | | | 5.73 |
| Example | 8 | 33.29 | 5.84 | 42.51 | 14.32 | | | 4.05 |
| Example | 9 | 52.10 | 4.15 | 18.15 | 22.92 | | 2.68 | |
| Example | 10 | 51.93 | 4.14 | 18.09 | 20.31 | | 2.67 | 2.87 |
| Example | 11 | 52.04 | 4.15 | 18.12 | 20.35 | | | 5.35 |
| Example | 12 | 51.18 | 6.41 | 3.63 | 21.78 | 14.40 | | 2.60 |
| Example | 13 | 53.46 | 6.70 | 3.79 | 9.58 | 23.76 | | 2.71 |
| Example | 14 | 61.35 | 5.98 | 1.93 | 29.01 | | | 1.73 |

TABLE 5

Firing conditions in examples and comparative example

| Example | | Temperature (° C.) | Ambient pressure (Mpa) | Time (hour) |
|---|---|---|---|---|
| Comparative example | 1 | 1900 | 1 | 2 |
| Example | 2 | 1800 | 1 | 2 |
| Example | 3 | 1800 | 1 | 2 |
| Example | 4 | 1800 | 1 | 2 |
| Example | 5 | 1800 | 1 | 2 |
| Example | 6 | 1900 | 1 | 2 |
| Example | 7 | 1900 | 1 | 2 |
| Example | 8 | 1900 | 1 | 2 |
| Example | 9 | 1900 | 1 | 2 |
| Example | 10 | 1900 | 1 | 2 |
| Example | 11 | 1900 | 1 | 2 |
| Example | 12 | 1800 | 1 | 2 |
| Example | 13 | 1800 | 1 | 2 |
| Example | 14 | 1700 | 1 | 2 |

Next, each synthesized compound was ground using an agate mortar and the powder X-ray diffraction measurement using Cu Kα-line was carried out. Main formation phases are shown in Table 6. As a result, it was confirmed that a phase having a crystal structure identical to the crystal structure of the $Ba_1Si_7N_{10}$ crystal was the main formation phases. Further, it was confirmed that the synthesized material included a rare earth element, an alkaline earth metal, Si, and N, and further included Al and O in some cases by the measurement of EDS. Further, the presence of Li was confirmed by the laser ablation ICP mass spectrometry measurement. That is, it was confirmed that the synthesized material was a phosphor including an inorganic compound in which Li and M as the light-emitting ion such as Eu were solid-solved into the crystal having the same crystal structure as the $Ba_1Si_7N_{10}$ crystal.

TABLE 6

Main formation phases in examples and comparative example

| Example | | Main formation phases Main phase |
|---|---|---|
| Comparative example | 1 | Crystal structure identical to that of Table 1 |
| Example | 2 | Crystal structure identical to that of Table 1 |
| Example | 3 | Crystal structure identical to that of Table 1 |
| Example | 4 | Crystal structure identical to that of Table 1 |
| Example | 5 | Crystal structure identical to that of Table 1 |
| Example | 6 | Crystal structure identical to that of Table 1 |
| Example | 7 | Crystal structure identical to that of Table 1 |
| Example | 8 | Crystal structure identical to that of Table 1 |
| Example | 9 | Crystal structure identical to that of Table 1 |
| Example | 10 | Crystal structure identical to that of Table 1 |
| Example | 11 | Crystal structure identical to that of Table 1 |
| Example | 12 | Crystal structure identical to that of Table 1 |
| Example | 13 | Crystal structure identical to that of Table 1 |
| Example | 14 | Crystal structure identical to that of Table 1 |

After firing, the obtained firing products were crushed coarsely and further ground by hand using a crucible and mortar made of silicon nitride sintered body, and then allowed to pass a 30 μm-mesh sieve. When the particle size distribution was measured, the mean particle diameter was 3 to 8 μm.

As a result of irradiating light of wavelength of 365 nm onto these powder samples using a lamp which emits the light, it was confirmed that these powder samples emit light of white color. After taking out a particle from the powder, the emission spectrum and the chromaticity based on CIE 1931 were measured by the same way as used in Example 1. As shown in Table 7, the phosphor was confirmed to be a phosphor to emit light of white color upon excitation by the ultraviolet ray of 365 nm.

TABLE 7

Emission characteristics and chromaticity in examples and comparative example

| Example | | Emission peak wavelength (nm) | Emission intensity (arbitrary unit) | Chromaticity x | y |
|---|---|---|---|---|---|
| Comparative example | 1 | 479 | 0.48 | 0.16 | 0.27 |
| Example | 2 | 555 | 0.97 | 0.37 | 0.43 |
| Example | 3 | 558 | 0.25 | 0.38 | 0.44 |
| Example | 4 | 551 | 0.81 | 0.33 | 0.39 |
| Example | 5 | 543 | 0.81 | 0.34 | 0.41 |
| Example | 6 | 560 | 0.81 | 0.4 | 0.45 |
| Example | 7 | 564 | 0.56 | 0.4 | 0.45 |
| Example | 8 | 564 | 0.96 | 0.4 | 0.46 |
| Example | 9 | 525 | 0.9 | 0.32 | 0.38 |
| Example | 10 | 555 | 0.88 | 0.38 | 0.45 |
| Example | 11 | 532 | 0.96 | 0.31 | 0.38 |
| Example | 12 | 566 | 0.95 | 0.38 | 0.44 |
| Example | 13 | 596 | 0.83 | 0.38 | 0.4 |
| Example | 14 | 480 | 0.5 | 0.32 | 0.37 |

Here, a portion in which a raw material mixture composition and a chemical composition of the synthesized compound show discrepancy has a trace amount of substance mixed in the synthesized product as an impurity secondary phase.

Figure 4:
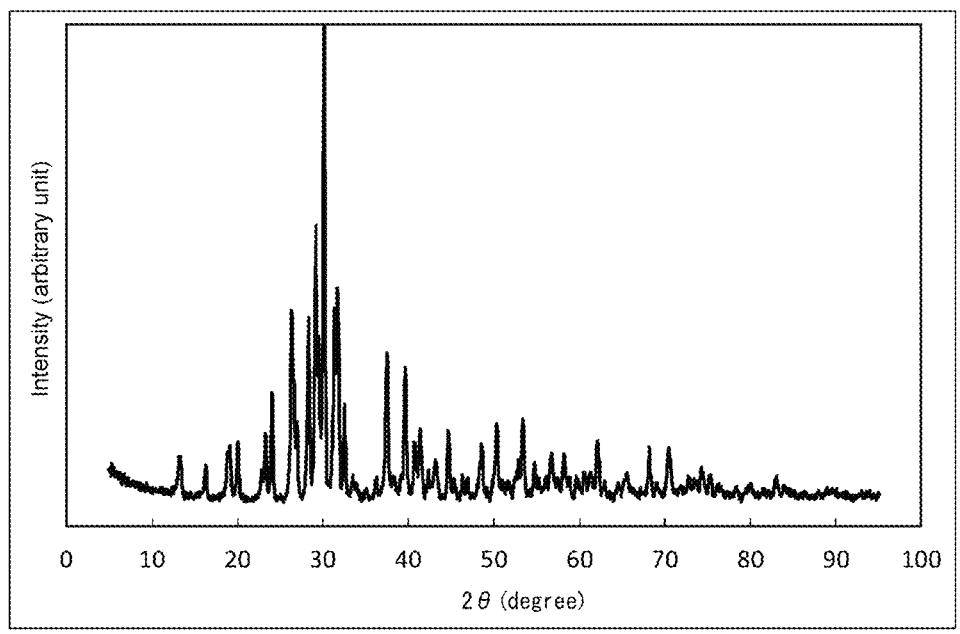
FIG. 4 is a diagram showing a resultant powder X-ray diffraction pattern of a phosphor synthesized in Example 14.

FIG. 4 is a diagram showing a resultant powder X-ray diffraction pattern of a phosphor synthesized in Example 14.

Figure 5:
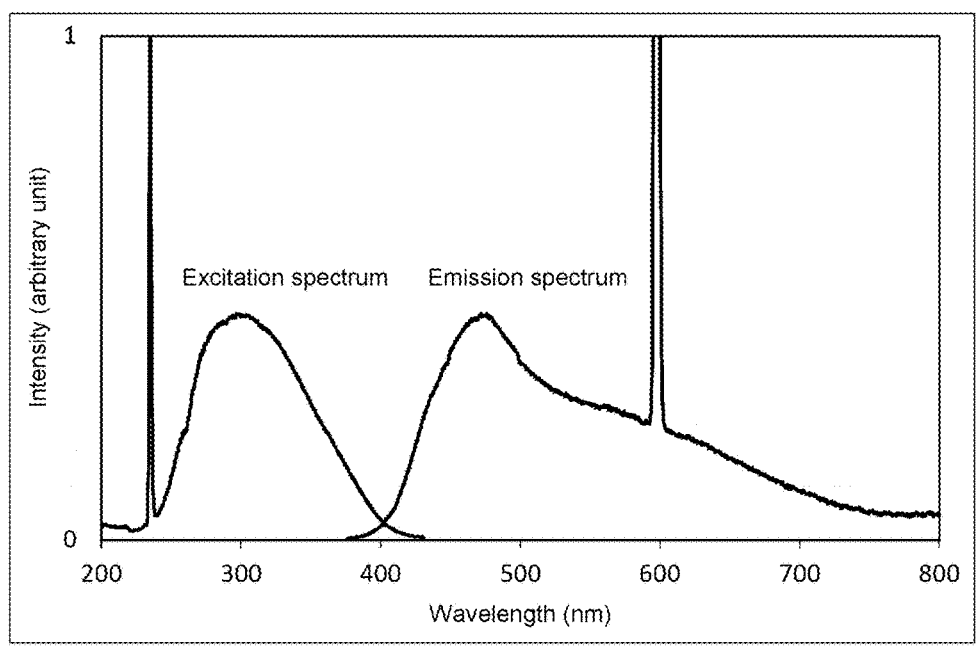
FIG. 5 is a diagram showing an excitation spectrum and an emission spectrum of a powder phosphor synthesized in Example 14.

FIG. 5 is a diagram showing an excitation spectrum and an emission spectrum of the phosphor powder synthesized in Example 14.

The results of powder X-ray diffraction of the synthesized phosphors (FIG. 4) show a good agreement with the results of structure analysis (FIG. 2). In Example 14, the measured X-ray diffraction pattern is the same as the $Ba_1Si_7N_{10}$ crystal, and the crystal having the same crystal structure as the $Ba_1Si_7N_{10}$ crystal was confirmed to be the main component. Further, in Example 14, the synthesized material was confirmed to include Li, Eu, Ba, Si, Al and N from the measurements of the laser ablation ICP mass spectrometry and the EDS. It was also confirmed that the ratio of (Ba+Eu):(Si+Al) was 1:7. That is, the synthesized material was confirmed to be a phosphor comprising an inorganic compound as the main component in which Li and Eu were solid-solved into the $Ba_1Si_7N_{10}$ system crystal. In Example 14, it is understood that the phosphor was found to allow excitation at 298 nm most efficiently, and the emission spectrum was found to emit light having a peak at 472 nm when the phosphor was excited by light of 298 nm. Further, an emission color of the phosphor of Example 14 was confirmed to be within the following range:
$0.25 \leq x \leq 0.45$; and $0.25 \leq y \leq 0.45$
in the CIE 1931 chromaticity coordinates.

If the chromaticity coordinates of CIE 1931 in Table 7 were referred to, it should be understood that the phosphor of Comparative example 1 emitted light of blue color and the phosphors of Examples 1 to 14 emitted light of white color including from bluish white color to reddish white color. From this point, it is indicated that the emission color was changed dramatically from blue color emission to white color emission as the $Ba_1Si_7N_{10}$ system crystal included Li.

Figure 6:
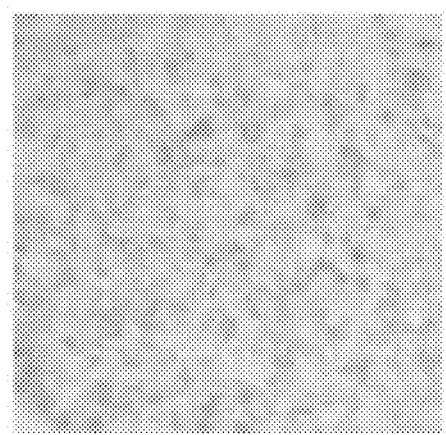
FIG. 6 is a diagram showing an object color of a synthesized phosphor in Example 14.

FIG. 6 is a diagram showing an object color of a phosphor synthesized in Example 14. Here, the diagram is shown in black and white due to the regulation of the application documents, but the original picture is in color and the color figure is readily submitted upon request.

According to FIG. 6, it was confirmed that the synthesized compound obtained in Example 14 had a white color as an object color and was excellent in the coloration. Although not shown in the figure, synthesized compounds of other Examples also exhibited similar object color. It was understood that the synthesized compound of the present invention could be used as the pigment or the fluorescent pigment.

Examples of Light-Emitting Device and Image Display Device; Examples 15 to 18

Next, a light-emitting device utilizing the phosphor of the present invention will be described.

Example 15

Figure 7:
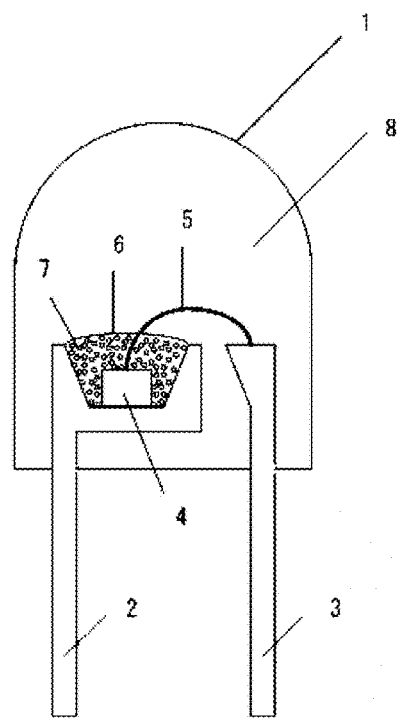
FIG. 7 is a schematic diagram showing an illuminating device (bullet-type of LED illuminating device) according to the present invention.

FIG. 7 is a schematic diagram showing an illuminating device (bullet-type of LED illuminating device) according to the present invention.

A so-called bullet-type white light-emitting diode lamp (1) shown in FIG. 7 was produced. There are two lead wires (2, 3), one of which (2) has a recess, in which an ultraviolet light-emitting diode element (4) having an emission peak of 365 nm is placed. The lower electrode of the ultraviolet light-emitting diode element (4) and the bottom surface of the recess are electrically connected with conductive paste, and the upper electrode and the other lead wire (3) are electrically connected through a gold thin wire (5). The phosphor (7) is dispersed in resin and mounted in the vicinity of the light-emitting diode element (4). The first resin (6) in which this phosphor is dispersed is transparent, and covers the entire ultraviolet light-emitting diode element (4). The tip-top portion of the lead wire including the recess, the blue light-emitting diode element, and the first resin in which the phosphor is dispersed are sealed with transparent second resin (8). A second resin (8) which is transparent is formed approximately in a cylindrical shape as a whole and the top portion is rounded in a lens shape such that the lamp is generally referred to as a bullet-type.

In the present embodiment, the phosphor synthesized in Example 14 in a powder state and emitting light of white color (hereinafter referred to as simply white color phosphor for the phosphor in Example 14) was blended with epoxy resin by the concentration of 37 wt %, and an appropriate amount of blended mixture was dropped with a dispenser, and the mixture (7) in which the phosphor was blended was dispersed in the first resin (6) so as to be formed. The coloration of the thus-obtained light-emitting device was x=0.32 and y=0.37 and exhibited white color.

Example 16

Figure 8:
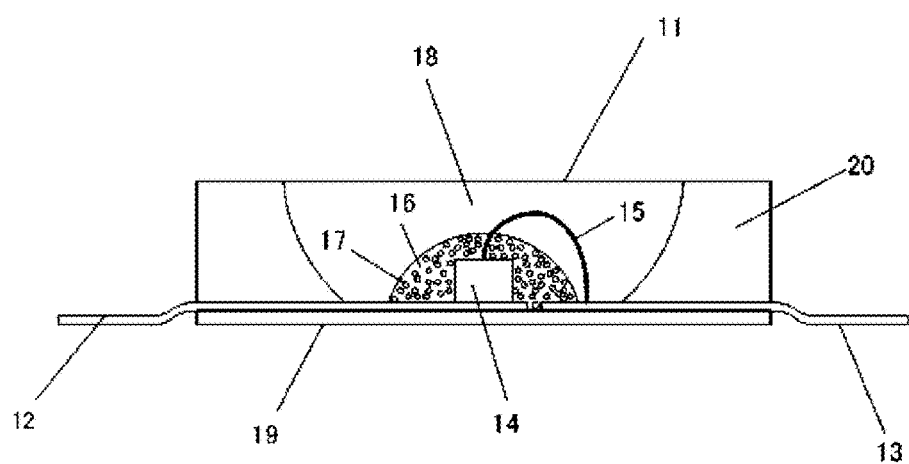
FIG. 8 is a schematic diagram showing an illuminating device (board-mounting-type LED illuminating device) according to the present invention.

FIG. 8 is a schematic diagram showing an illuminating device (board-mounting-type LED illuminating device) according to the present invention.

A chip-type white light-emitting diode lamp (11) for board-mounting as shown in FIG. 8 was produced. Two lead wires (12, 13) are fixed to a white alumina ceramic board (19) having high reflectance of visible light and one end of each of the wires is located at approximately the center portion of the board and the other end of each of the wires extends outside to serve as an electrode to be soldered when the lamp is mounted on the electric board. One of the lead wires (12) has the one end on which an blue light-emitting diode element (14) having an emission peak wavelength of 450 nm is placed and fixed thereto such that the element is located at the center of the board. The lower electrode of the blue light-emitting diode element (14) and the lead wire below are electrically connected with conductive paste, and the upper electrode and the other lead wire (13) are electrically connected to a gold thin wire (15).

The first resin (16) and a white color phosphor (17) synthesized in Example 14 are mounted in the vicinity of the light-emitting diode device. The first resin in which this phosphor is dispersed is transparent, and covers the entire blue color light-emitting diode element (14). Also, a wall surface member (20) having a hole opened at the center portion is fixed to the ceramic board. The wall surface member (20) has the center portion formed as the hole in which the blue color light-emitting diode element (14) and the resin (16) having the phosphor (17) dispersed therein are contained and the portion of the hole facing the center is made to be a slope. This slope is a reflective surface for taking out light forward, and the shape of the curved surface of the slope is determined in consideration of the direction of light reflection. Further, at least the surface which constitutes the reflective surface forms a surface having high visible light reflectance with white color or metallic luster. In the present example, the wall surface member (20) is configured with white silicone resin. The hole at the center portion of the wall surface member is formed with a recess as the final shape of the chip-type light-emitting diode lamp, and is filled up with second transparent resin (18) to seal all of the blue light-emitting diode element (14) and the first resin (16) in which the phosphor (17) is dispersed. In the present example, the same epoxy resin was used for both the first resin (16) and second resin (18). The percentage of phosphor addition, the attained chromaticity, and the like are approximately identical to those in Example 15.

Next, an example of design of an image display device using the phosphor of the present invention is described.

Example 17

Figure 9:
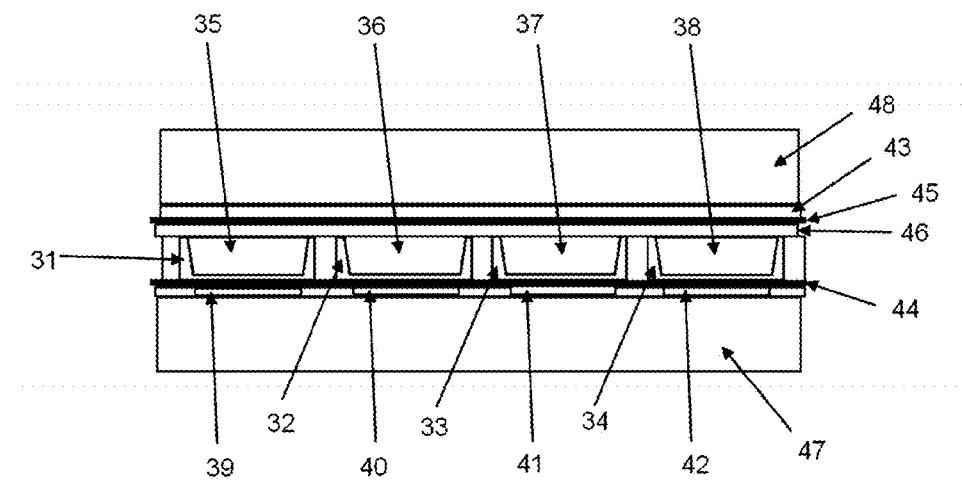
FIG. 9 is a schematic diagram showing an image display device (plasma display panel) according to the present invention.

FIG. 9 is a schematic diagram showing an image display device (plasma display panel) according to the present invention.

A red phosphor (CaAlSiN$_3$:Eu$^{2+}$), a green phosphor (β-sialon:Eu$^{2+}$), a blue phosphor(BAM:Eu$^{2+}$), and a white phosphor of Example 14 of the present invention (31), (32), (33), (34) are applied to inner surfaces of the respective cells (35, 36, 37, 38), which are arranged via electrodes (39, 40, 41, 42) and a dielectric layer (44) over a glass substrate (47). If electric power is supplied to the electrodes (39, 40, 41, 42), a vacuum ultraviolet ray is generated by Xe discharge in each of the cells, thereby exciting the respective phosphors so as to emit visible light of a red color, a green color, a blue color and a white color such that the emitted light may be observed from the outside through a protective layer (46), a dielectric layer (45), and a glass substrate (48) so as to serve as an image display device.

Example 18

Figure 10:
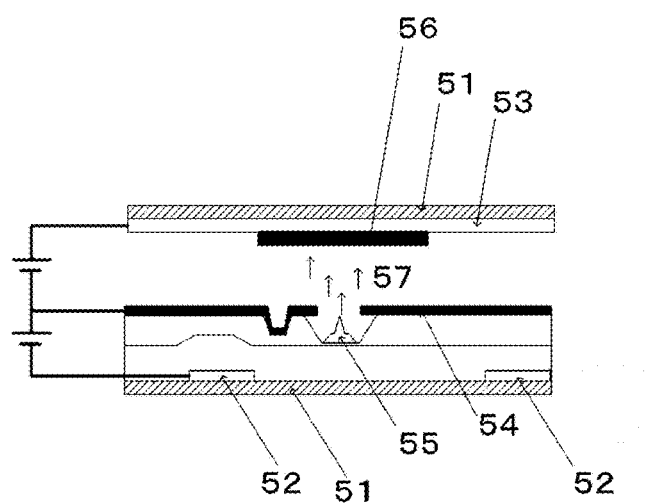
FIG. 10 is a schematic diagram showing an image display device (field emission display panel) according to the present invention.

FIG. 10 is a schematic diagram showing an image display device (field emission display panel) according to the present invention.

The white phosphor (56) of Example 14 of the present invention is applied to an interior surface of an anode (53). By applying a voltage between a cathode (52) and a gate (54), electrons (57) are emitted from an emitter (55). The electrons are accelerated by the voltage between the anode (53) and cathode, and impinge on the white phosphor (56) to excite the white phosphor to emit light of white color. The entire device is protected by a glass (51). The drawing shows a single light emission cell comprising one emitter and one white phosphor. However, an actual display emitting a variety of colors is configured by arranging a large number of blue, red and green cells besides white cells. Although the phosphors to be used for cells for a green color and a red color are not particularly specified, a phosphor which exhibits high brightness under a low speed electron beam is preferable.

INDUSTRIAL APPLICABILITY

The phosphor of the present invention has different emission characteristics (emission color and excitation characteristics, emission spectrum) from those of the conventional phosphor, exhibits high emission intensity in the case where it is combined with a LED of 470 nm or less, is chemically and thermally stable, and further has little degradation in the intensity of the phosphor when it is exposed to the excitation source such that it is used suitably for the VFD, the FED, the PDP, the CRT, the white LED, and so on. It is expected that the phosphor of the present invention will be utilized in material design in various kinds of display devices in the future so as to contribute to the development of the industry.

EXPLANATION OF NUMERALS 1 bullet-type light-emitting diode lamp.
2, 3 lead wire.
4 light-emitting diode element.
5 bonding wire.
6, 8 resin.
7 phosphor.
11 chip-type white light-emitting diode lamp for board-mounting.
12, 13 lead wire.
14 light-emitting diode element.
15 bonding wire.
16, 18 resin.
17 phosphor.
19 alumina ceramic board.
20 wall surface member.
31 red phosphor.
32 green phosphor.
33 blue phosphor.
34 white phosphor.
35, 36, 37, 38, ultraviolet ray emission cell.
39, 40, 41, 42 electrode.
43, 44 dielectric layer.
46 protective layer.
47, 48 glass substrate.
51 glass.
52 cathode.
53 anode.
54 gate.
55 emitter.
56 phosphor.
57 electrons.

What is claimed is:

1. A phosphor comprising an inorganic compound in which an inorganic crystal including at least an A element, a D element, and an X element (where A is one or two or more elements selected from the group consisting of Mg, Ca, Sr, and Ba; D is one or two or more elements selected from the group consisting of Si, Ge, Sn, Ti, Zr, and Hf; and X is one or two or more elements selected from the group consisting of O, N, and F), further, when necessary, an E element (where E is one or two or more elements selected from the group consisting of B, Al, Ga, In, Sc, Y, and La), and comprising any of (1) a crystal represented by A$_1$(D, E)$_7$X$_{10}$; (2) a Sr$_1$Si$_7$N$_{10}$ crystal or a crystal having a same crystal structure as the Sr$_1$Si$_7$N$_{10}$ crystal; or (3) a Ba$_1$Si$_7$N$_{10}$ crystal or a crystal having a same crystal structure as the Ba$_1$Si$_7$N$_{10}$ crystal, and comprising a Li element and an M element (where M is one or two or more elements selected from the group consisting of Mn, Ce, Pr, Nd, Sm, Eu, Tb, Dy, and Yb,)

wherein the inorganic crystal is represented by a composition formula L$_c$M$_d$A$_e$D$_f$E$_g$X$_h$ (here, in the formula, c+d+e+f+g+h=1, L is the Li element) and parameters c, d, e, f, g, and h satisfy all conditions $$0.001 \leq c \leq 0.7,$$

$$0.00001 \leq d \leq 0.05,$$

$$0.01 \leq e \leq 0.1,$$

$$0.1 \leq f \leq 0.4,$$

$$0 \leq g \leq 0.1, \text{ and}$$

$$0.15 \leq h \leq 0.65,$$

wherein the inorganic compound emits white color fluorescence upon irradiation by an excitation source.

2. The phosphor according to claim 1 wherein the Li element and the M element are solid-solved into the inorganic crystal.

3. The phosphor according to claim 2 wherein the Li element is solid-solved into the inorganic crystal as an interstitial solid solution.

4. The phosphor according to claim 1 wherein:
the A element is one kind of or two kinds of mixture selected from a group consisting of Sr and Ba,
the D element is Si,
the E element is Al,
the X element is N or a mixture of N and O, and
the M element is Eu.

5. The phosphor according to claim 1 wherein the inorganic crystal is a crystal that belongs to a monoclinic system and has a symmetry of space group $P_c$, and wherein lattice constants thereof a, b, and c and angles $\alpha$, $\beta$, and $\gamma$ have values in following ranges:
a=0.68875±0.05 nm,
b=0.67102±0.05 nm,
c=0.96756±0.05 nm,
$\alpha$=90±1.5 degree,
$\beta$=106.17±1.5 degree, and
$\gamma$=90±1.5 degree.

6. The phosphor according to claim 1
wherein the parameters d, e, f, and g have values in a range where all conditions $(d+e)/(d+e+f+g)=1/8\pm0.014$ are satisfied.

7. The phosphor according to claim 1
wherein the parameters f and g satisfy condition $0.8 \leq f/(f+g) \leq 1.0$.

8. The phosphor according to claim 1
wherein the white color fluorescence having a peak at a wavelength in a range from 470 nm to 620 nm is emitted upon irradiation by the excitation source.

9. The phosphor according to claim 8
wherein the excitation source comprises a vacuum ultraviolet ray, an ultraviolet ray, or visible light having a wavelength that is at least 100 nm and not exceeding 410 nm, or an electron beam or an X-ray.

10. The phosphor according to claim 1
wherein the white color fluorescence emitted upon irradiation by the excitation source satisfies, in terms of values of (x, y) of CIE 1931 chromaticity coordinates, following conditions $0.25 \leq x \leq 0.45$ and $0.25 \leq y \leq 0.45$.

11. The phosphor according to claim 1
wherein the Li and Al and Eu are solid-solved into a $Ba_1Si_7N_{10}$ crystal, and
wherein, upon irradiation of light of 280 nm to 410 nm, light having chromaticity is emitted where values of (x, y) of CIE 1931 chromaticity coordinates are in ranges $0.25 \leq x \leq 0.45$ and
$0.25 \leq y \leq 0.45$.

12. A method of manufacturing the phosphor as recited in claim 1 comprising:
firing a raw material mixture to be constituted of the phosphor as recited in claim 1 in an inert atmosphere including nitrogen at a temperature range of at least 1200° C. to not exceeding 2200° C., the raw material mixture being a mixture of metal compounds and being fired to become the phosphor as recited in claim 1.

13. A light-emitting device comprising at least an excitation light-emitting body and a phosphor wherein the phosphor includes at least the phosphor as recited in claim 1.

14. An image display device comprising an excitation source and a phosphor wherein at least the phosphor as recited in claim 1 is utilized.

15. A pigment or an ultraviolet absorber comprising the inorganic compound as recited in claim 1.

* * * * *